United States Patent
Nihei et al.

(10) Patent No.: US 7,009,430 B2
(45) Date of Patent: Mar. 7, 2006

(54) CIRCUIT FOR GENERATING PIXEL CLOCK WITH FINE PHASE CONTROL

(75) Inventors: Yasuhiro Nihei, Kanagawa (JP); Masaaki Ishida, Kanagawa (JP); Atsufumi Omori, Kanagawa (JP); Dan Ozasa, Kanagawa (JP)

(73) Assignee: Ricoh Company, Ltd., Tokyo (JP)

( * ) Notice: Subject to any disclaimer, the term of this patent is extended or adjusted under 35 U.S.C. 154(b) by 43 days.

(21) Appl. No.: 10/771,521

(22) Filed: Feb. 5, 2004

(65) Prior Publication Data

US 2004/0160509 A1 Aug. 19, 2004

(30) Foreign Application Priority Data

Feb. 7, 2003 (JP) .............................. 2003-031057

(51) Int. Cl.
*H03L 7/00* (2006.01)

(52) U.S. Cl. ...................................... 327/141; 327/298

(58) Field of Classification Search ................ 327/141, 327/162, 163, 291, 298–299
See application file for complete search history.

(56) References Cited

U.S. PATENT DOCUMENTS

| | | | |
|---|---|---|---|
| 5,138,623 A | 8/1992 | Ema et al. | 372/38.07 |
| 5,237,579 A | 8/1993 | Ema et al. | 372/31 |
| 5,258,780 A | 11/1993 | Ema et al. | 347/131 |
| 5,784,091 A | 7/1998 | Ema et al. | 347/131 |
| 5,946,334 A | 8/1999 | Ema et al. | 372/38.01 |
| 6,118,798 A | 9/2000 | Ema et al. | 372/29.011 |
| 6,498,617 B1 | 12/2002 | Ishida et al. | 347/252 |
| 6,791,596 B1 * | 9/2004 | Nihei et al. | 347/247 |

FOREIGN PATENT DOCUMENTS

| | | |
|---|---|---|
| JP | 11-167081 | 6/1999 |
| JP | 2001-228415 | 8/2001 |

* cited by examiner

*Primary Examiner*—Timothy P. Callahan
*Assistant Examiner*—Cassandra Cox
(74) *Attorney, Agent, or Firm*—Oblon, Spivak, McClelland, Maier & Neustadt, P.C.

(57) ABSTRACT

A circuit for generating a pixel clock for use in scanning a laser beam includes a high-frequency-clock generating circuit which generates a high-frequency clock having a higher frequency than the pixel clock, and a control circuit which generates the pixel clock while shifting a phase of the pixel clock by a shift step proportional to a clock cycle of the high-frequency clock in response to phase data indicative of timing and amounts of phase shifts.

9 Claims, 24 Drawing Sheets

FIG.8A

| PHASE SHIFT AMOUNT | PHASE DATA 3bit |
|---|---|
| 3/8 PCLK DELAY | 000 |
| 2/8 PCLK DELAY | 001 |
| 1/8 PCLK DELAY | 010 |
| 0 | 011 |
| 1/8 PCLK ADVANCEMENT | 100 |
| 2/8 PCLK ADVANCEMENT | 101 |
| 3/8 PCLK ADVANCEMENT | 110 |

FIG.8B

| PHASE DATA 3bit | OUT |
|---|---|
| 000 | D0 |
| 001 | D1 |
| 010 | D2 |
| 011 | D3 |
| 100 | D4 |
| 101 | D5 |
| 110 | D6 |

FIG.20

| PHASE SHIFT AMOUNT | PHASE DATA 3bit |
|---|---|
| 0 | 000 |
| 1/16 PCLK ADVANCEMENT | 001 |
| 2/16 PCLK ADVANCEMENT | 010 |
| 3/16 PCLK ADVANCEMENT | 011 |
| 1/16 PCLK DELAY | 111 |
| 2/16 PCLK DELAY | 110 |
| 3/16 PCLK DELAY | 101 |

FIG.22

| FIRST CONTROL DATA SECOND CONTROL DATA | CONTROL SIGNAL 1b | CONTROL SIGNAL 2b |
|---|---|---|
| 000 | S18 | S28 |
| 001 | S17 | S27 |
| 010 | S16 | S26 |
| 011 | S15 | S25 |
| 100 | S14 | S24 |

FIG.23

| PHASE DATA 3bit | STATUS SIGNAL | FIRST CONTROL DATA | SECOND CONTROL DATA |
|---|---|---|---|
| 000 | 0 | 010 | 010 |
| 000 | 1 | 010 | 010 |
| 001 | 0 | 010 | 001 |
| 001 | 1 | 001 | 010 |
| 010 | 0 | 001 | 001 |
| 010 | 1 | 001 | 001 |
| 011 | 0 | 001 | 000 |
| 011 | 1 | 000 | 001 |
| 111 | 0 | 011 | 010 |
| 111 | 1 | 010 | 011 |
| 110 | 0 | 011 | 011 |
| 110 | 1 | 011 | 011 |
| 101 | 0 | 100 | 011 |
| 101 | 1 | 011 | 100 |

FIG.26

| | SHIFT AMOUNT |
|---|---|
| 1 | 0 |
| 2 | 0 |
| 3 | 0 |
| 4 | −1 |
| 5 | 0 |
| 6 | 0 |
| 7 | −1 |
| 8 | 0 |
| 9 | 0 |
| 10 | −1 |
| 11 | 0 |
| 12 | 0 |
| ⋮ | ⋮ |
| 2395 | 0 |
| 2396 | 0 |
| 2397 | +1 |
| 2398 | 0 |
| 2399 | 0 |
| 2400 | +1 |
| 2401 | 0 |
| 2402 | 0 |
| 2403 | +1 |
| 2404 | 0 |
| 2405 | 0 |
| ⋮ | ⋮ |
| 4789 | 0 |
| 4790 | 0 |
| 4791 | −1 |
| 4792 | 0 |
| 4793 | 0 |
| 4794 | −1 |
| 4795 | 0 |
| 4796 | 0 |
| 4797 | −1 |
| 4798 | 0 |
| 4799 | 0 |
| 4800 | 0 |

200

+

| | SHIFT AMOUNT |
|---|---|
| 1 | 0 |
| 2 | 0 |
| 3 | 0 |
| 4 | 0 |
| 5 | 0 |
| 6 | 0 |
| 7 | 0 |
| 8 | 0 |
| 9 | 0 |
| 10 | +1 |
| 11 | 0 |
| 12 | 0 |
| ⋮ | ⋮ |
| 2395 | 0 |
| 2396 | 0 |
| 2397 | 0 |
| 2398 | 0 |
| 2399 | 0 |
| 2400 | +1 |
| 2401 | 0 |
| 2402 | 0 |
| 2403 | 0 |
| 2404 | 0 |
| 2405 | 0 |
| ⋮ | ⋮ |
| 4789 | 0 |
| 4790 | +1 |
| 4791 | 0 |
| 4792 | 0 |
| 4793 | 0 |
| 4794 | 0 |
| 4795 | 0 |
| 4796 | 0 |
| 4797 | 0 |
| 4798 | 0 |
| 4799 | 0 |
| 4800 | +1 |

201

=

| | SHIFT AMOUNT |
|---|---|
| 1 | 0 |
| 2 | 0 |
| 3 | 0 |
| 4 | −1 |
| 5 | 0 |
| 6 | 0 |
| 7 | −1 |
| 8 | 0 |
| 9 | 0 |
| 10 | 0 |
| 11 | 0 |
| 12 | 0 |
| ⋮ | ⋮ |
| 2395 | 0 |
| 2396 | 0 |
| 2397 | +1 |
| 2398 | 0 |
| 2399 | 0 |
| 2400 | +2 |
| 2401 | 0 |
| 2402 | 0 |
| 2403 | +1 |
| 2404 | 0 |
| 2405 | 0 |
| ⋮ | ⋮ |
| 4789 | 0 |
| 4790 | +1 |
| 4791 | −1 |
| 4792 | 0 |
| 4793 | 0 |
| 4794 | −1 |
| 4795 | 0 |
| 4796 | 0 |
| 4797 | −1 |
| 4798 | 0 |
| 4799 | 0 |
| 4800 | +1 |

202

CIRCUIT FOR GENERATING PIXEL CLOCK WITH FINE PHASE CONTROL

BACKGROUND OF THE INVENTION

1. Field of the Invention

The present invention generally relates to the generation and phase control of a pixel clock for use in laser printers, digital copiers, and other image forming apparatuses in general, and particularly relates to a pixel-clock generating circuit and an image forming apparatus having such a circuit wherein the pixel-clock generation circuit achieves highly precise phase control of a pixel clock.

2. Description of the Related Art

FIG. 25 is an illustrative drawing showing a general construction of an image forming apparatus such as a laser printer or a digital copier. In FIG. 25, a laser beam emitted by a semiconductor laser unit 1001 is scanned by a rotating polygon mirror 1002, and forms a light spot through a scan lens 1003 on a photoconductor 1004 serving as a medium to be scanned, thereby forming a latent image through the exposure of the photoconductor 1004 to light. For this purpose, a clock generating circuit 1008 generates a clock signal. Based on this clock signal, a phase synchronizing circuit 1009 generates an image clock signal (pixel clock) having synchronized phase with respect to each line in response to an output signal of a photo-detector 1005. The image clock signal is supplied to an image-processing unit 1006 and a laser drive circuit 1007. With this provision, the laser drive circuit 1007 controls the timing of laser emission according to image data generated by the image-processing unit 1006 and the image clock signal having its phase controlled by the phase synchronizing circuit 1009 for each line, thereby controlling the latent image on the photoconductor 1004.

In this optical scan system, the deflection surfaces of a deflector such as a polygon scanner may have varying distances from the center of rotation. Such variation causes fluctuation of scanning speed as the light spot (scan beam) scans over a target surface. The fluctuation of scanning speed results in fluctuation of images, causing degradation of image quality. When high image quality is required, thus, the fluctuation of scanning needs to be corrected. In the case of a multi-beam optical system, a difference in the wavelengths of light sources results in the error of exposed positions where the optical system is not corrected for chromatic aberration of the scan lens. The width of scanning when the light spots of respective light sources scan over the target medium differs for each light source, causing degradation of image quality. This gives rise to a need for the correction of scan widths.

As a conventional technology for correcting the fluctuation of scanning or the like, the position of a light spot is controlled along a scan line by changing the frequency of a pixel clock as disclosed in Patent Document 1 and Patent Document 2.

[Patent Document 1] Japanese Patent Application Publication No. 11-167081

[Patent Document 2] Japanese Patent Application Publication No. 2001-228415

However, the conventional scheme that changes the frequency of a pixel clock has a drawback in that the construction of a pixel-clock control unit becomes excessively complex, and that such complexity increases as the step of frequency modulation becomes finer. This prohibits diligent frequency control.

Accordingly, there is a need for a pixel-clock generating circuit and an image forming apparatus having such a circuit wherein pixel-clock generating circuit has a simple construction for achieving the phase control of a pixel clock.

SUMMARY OF THE INVENTION

It is a general object of the present invention to provide a pixel-clock generating circuit and an image forming apparatus having such a circuit that substantially obviate one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a pixel-clock generating circuit and an image forming apparatus having such a circuit particularly pointed out in the specification in such full, clear, concise, and exact terms as to enable a person having ordinary skill in the art to practice the invention.

To achieve these and other advantages in accordance with the purpose of the invention, the invention provides a circuit for generating a pixel clock for use in scanning a laser beam, including a high-frequency-clock generating circuit which generates a high-frequency clock having a higher frequency than the pixel clock, and a control circuit which generates the pixel clock while shifting a phase of the pixel clock by a shift step proportional to a clock cycle of the high-frequency clock in response to phase data indicative of timing and amounts of phase shifts.

An image forming apparatus includes a pixel-clock generating unit which generates a pixel clock, a laser drive unit which emits a laser beam in response to the pixel clock and image data, a photoconductor, and a deflector which scans the laser beam on the photoconductor to form an image on the photoconductor, wherein the pixel-clock generating unit includes a high-frequency-clock generating circuit which generates a high-frequency clock having a higher frequency than the pixel clock, and a control circuit which generates the pixel clock while shifting a phase of the pixel clock by a shift step proportional to a clock cycle of the high-frequency clock in response to phase data indicative of timing and amounts of phase shifts.

In the pixel-clock generating circuit and the image forming apparatus described above, the phase of the pixel clock is controlled by utilizing the high-frequency clock so as to achieve a phase shift by increments of a shift step proportional to the clock cycle of the high-frequency clock. Also, the phase shift is controlled by the phase data. This provides for a simple circuit construction to achieve the fine and diligent phase control of the pixel clock.

Other objects and further features of the present invention will be apparent from the following detailed description when read in conjunction with the accompanying drawings.

BRIEF DESCRIPTION OF THE DRAWINGS

FIG. 8A is a diagram showing the relationship between phase shifts and phase data;

FIG. 8B is a diagram showing the relationship between the phase data and a signal to be selected;

FIG. 20 is a diagram showing the relationship between phase shifts and phase data;

FIG. 22 is a diagram showing a truth table of multiplexers;

FIG. 23 is a diagram showing a truth table of the control-data generating circuit;

FIG. 26 is a diagram showing the correction of phase data based on a measured time difference.

DESCRIPTION OF THE PREFERRED EMBODIMENTS

In the following, embodiments of the present invention will be described with reference to the accompanying drawings.

Figure 1:
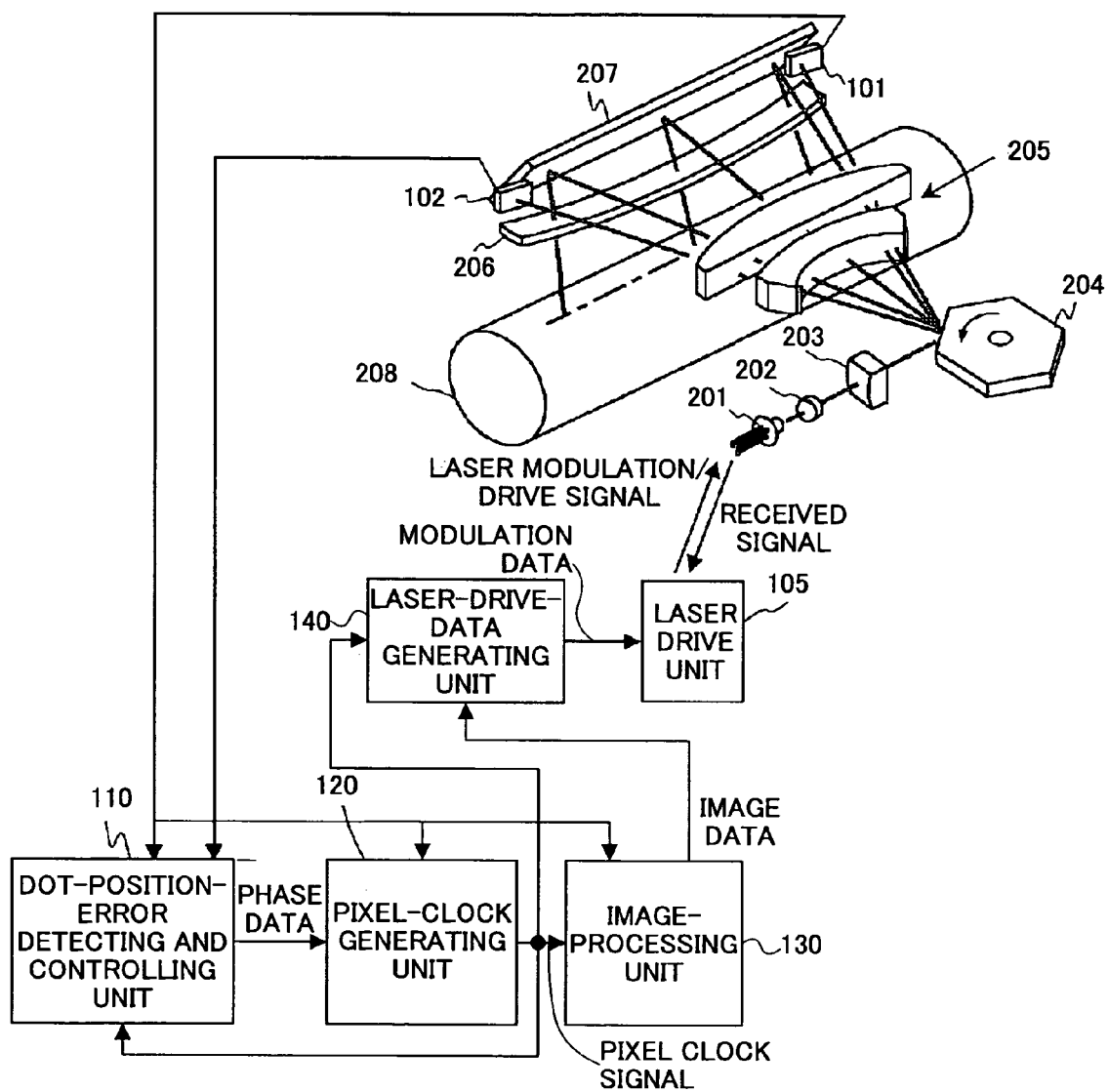
FIG. 1 is an illustrative drawing showing the overall construction of an embodiment of an image forming apparatus that includes a pixel-clock generating circuit according to the invention.

FIG. 1 is an illustrative drawing showing the overall construction of an embodiment of an image forming apparatus that includes a pixel-clock generating circuit according to the invention. The image forming apparatus of FIG. 1 includes a semiconductor laser 201, which emits laser light for a desired duration under the control of a laser drive unit 150. The laser beam emitted from the semiconductor laser 201 is shaped by a collimator lens 202 and a cylinder lens 203. The shaped laser beam is then directed to a polygon mirror 204, and is reflected so as to scan over a photoconductor 208 in a periodic fashion. Before illuminating the photo conductor 208, the laser beam reflected by the polygon mirror 204 travels through an fθ lens 205, a mirror 207, and a toroidal lens 206 for proper positioning of an optical axis. The laser beam directed in this manner is shone on and forms a light spot on the photoconductor 20 serving as a scanned medium. As a result, an image (latent image) responsive to the output of the semiconductor laser 201 is formed on the photoconductor 208.

Photo-detectors 101 and 102 are provided at opposite ends of the mirror 207, respectively, so as to detect the start and end of each scan. Namely, the laser beam reflected in a desired direction by the polygon mirror 204 is input into the photo-detector 101 before scanning one line over the photoconductor 208, and is input into the photo-detector 102 after scanning one line. The photo-detectors 101 and 102 convert the incident laser light into electrical signals (i.e., first and second horizontal synchronizing signals), which are supplied to a dot-position-error detecting and controlling unit 110. Thus, the dot-position-error detecting and controlling unit 110 receives a timing signal (the first horizontal synchronizing signal) indicative of the start of each scan line and a timing signal (the second horizontal synchronizing signal) indicative of the end of each scan line. The first horizontal synchronizing signal output from the photo-detector 101 is also supplied to a pixel-clock generating unit 120 as a line synchronizing signal.

The dot-position-error detecting and controlling unit 110 measures a time difference between the two electrical signals (the first and second horizontal synchronizing signals) supplied from the photo-detectors 101 and 102, respectively. Based on the measured time difference, an error of a scan time is obtained for each line. To this end, the measured time difference may be compared with a preset reference time length, or a similar method may be employed.

The dot-position-error detecting and controlling unit 110 generates phase data for correction of the obtained error. The phase data may be used for correcting the fluctuation of scanning caused by the characteristics of an optical system comprised of a scan lens and the like, for correcting the error of dot positions caused by the fluctuation of rotation of the polygon mirror 204, and/or for correcting the error of dot positions caused by chromatic aberration of laser light. Such phase data contains instruction for a specific phase shift of the pixel clock. The generated phase data is supplied to the pixel-clock generating unit 120.

The pixel-clock generating unit 120 generates a pixel clock signal (PCLK) in phase synchronization with the first horizontal synchronizing signal output from the photo-detector 101. The pixel clock signal is used as a timing signal for driving the semiconductor laser 201 based on the phase data supplied from the dot-position-error detecting and controlling unit 110. The generated pixel clock (PCLK) is supplied to an image-processing unit 130 and a laser-drive-data generating unit 140. The pixel-clock generating unit 120 is a pixel-clock generating circuit of the invention, the detail of which will be described with reference to FIG. 2 and drawings subsequent thereto.

The image-processing unit 130 generates image data on the basis of the pixel clock (PCLK) supplied from the pixel-clock generating unit (pixel-clock generating circuit) 120, and supplies the image data to the laser-drive-data generating unit 140. The laser-drive-data generating unit 140 generates laser-drive data (modulation data) from the supplied image data on the basis of the pixel clock (PCLK) supplied from the pixel-clock generating unit (pixel-clock generating circuit) 120. The laser-drive data is provided to the laser drive unit 150. The laser drive unit 150 drives the semiconductor laser 201 according to the supplied laser-drive data (modulation data). This makes it possible to form an image on the photoconductor 208 free from the effect of fluctuation of scanning.

In the following, a description will be given of various embodiments of the pixel-clock generating unit 120, i.e., the pixel-clock generating circuit of the invention, of the above-mentioned image forming apparatus with reference to the drawings.

<Embodiment 1>

Figure 2:
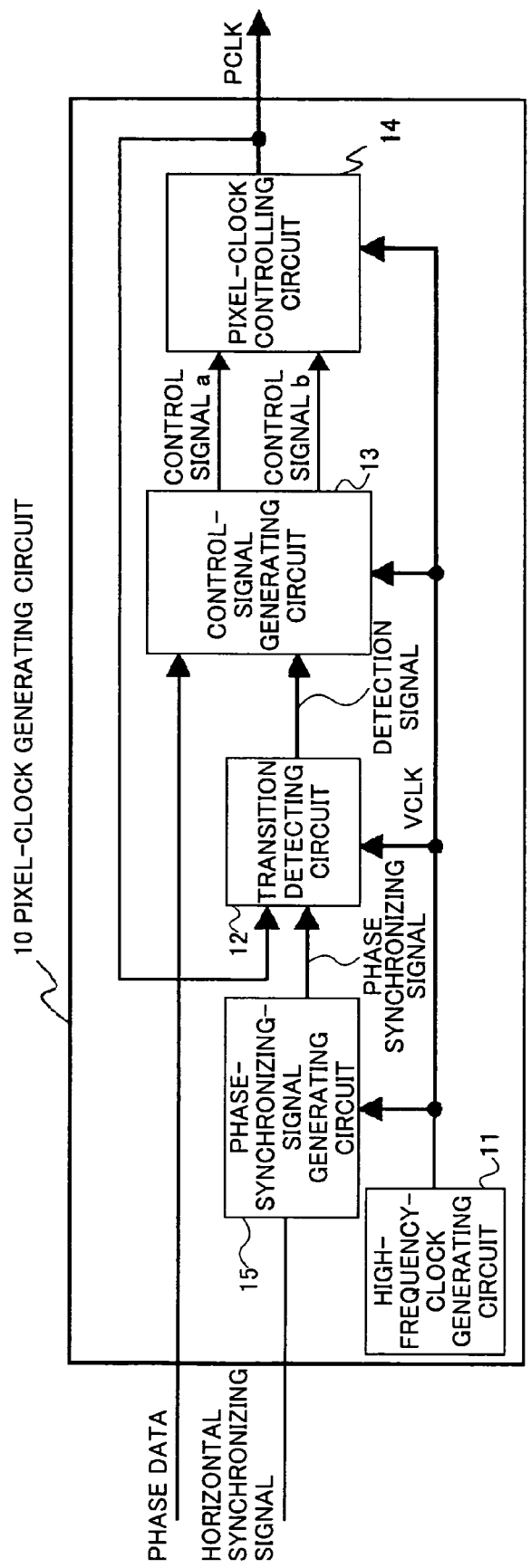
FIG. 2 is a block diagram showing the construction of the pixel-clock generating circuit according to a first embodiment.

FIG. 2 is a block diagram showing the construction of the pixel-clock generating circuit according to a first embodiment. In FIG. 2, a pixel-clock generating circuit 10 includes a high-frequency-clock generating circuit 11, a transition detecting circuit 12, a control-signal generating circuit 13, a pixel-clock controlling circuit 14, and a phase-synchronizing-signal generating circuit 15.

The high-frequency-clock generating circuit 11 generates a high-frequency clock VCLK, which serves as a basis for the pixel clock PCLK. The phase-synchronizing-signal generating circuit 15 synchronizes the horizontal synchronizing signal supplied from an exterior with the high-frequency clock so as to output it as a phase synchronizing signal. The transition detecting circuit 12 detects a transition of the phase synchronizing signal or the pixel clock. Specifically, the transition detecting circuit 12 detects a positive or negative transition of the pixel clock PCLK, and, in response thereto, outputs a pulse signal having a width equal to one clock cycle of the high-frequency clock VCLK. Moreover, the transition detecting circuit 12 detects a negative transition of the phase synchronizing signal, and, in response thereto, outputs a pulse signal having a width equal to one clock cycle of the high-frequency clock VCLK. The control-signal generating circuit 13 outputs a control signal a and a control signal b based on the externally supplied phase data indicative of a phase shift of the pixel clock and the detection signal output from the transition detecting circuit 12. The pixel-clock controlling circuit 14 controls the transition timing of the pixel clock PCLK based on the high-frequency clock VCLK, the control signal a, and the control signal b, thereby generating PLCK.

As previously described, the phase data indicates a phase shift (i.e., the amount of phase shift) of the pixel clock for the purpose of correcting the fluctuation of scanning caused by the characteristics of a scan lens, for correcting the error of dot positions caused by the fluctuation of rotation of a polygon mirror, and/or for correcting the error of dot positions caused by chromatic aberration of laser light. In this embodiment, the phase data is comprised of 3 bits, which are related to the amount of phase shift as shown in FIG. 8A.

Figure 3:
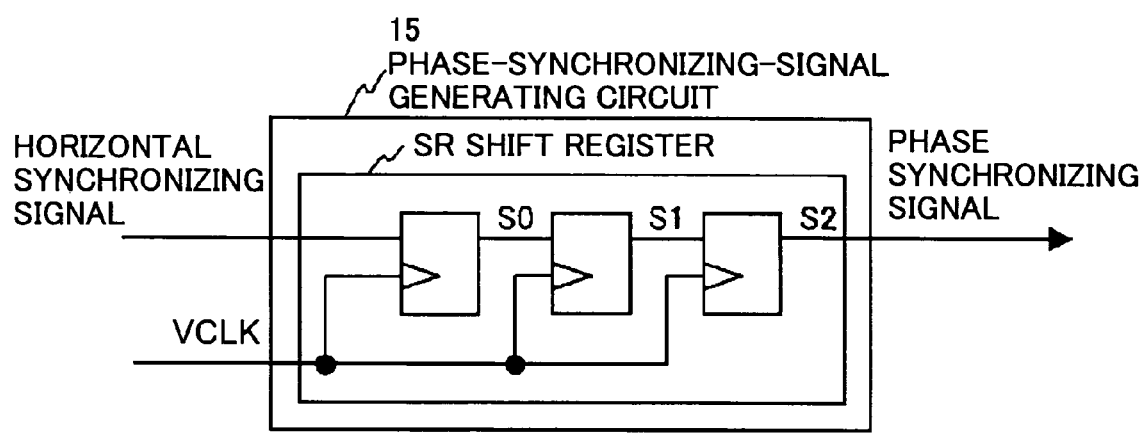
FIG. 3 is a circuit diagram showing an example of the construction of a phase-synchronizing-signal generating circuit of FIG. 2.

FIG. 3 is a circuit diagram showing an example of the construction of the phase-synchronizing-signal generating circuit 15 of FIG. 2. The phase-synchronizing-signal generating circuit 15 includes a shift register SR. The shift register SR performs a shift operation in response to the high-frequency clock VCLK, and synchronizes the supplied horizontal synchronizing signal with the high-frequency clock VCLK for outputting as the phase synchronizing signal. In FIG. 3, the supplied horizontal synchronizing signal is shifted so as to successively become S0, S1, and S2, with S2 being output as the phase synchronizing signal. The number of stages of the shift register SR controls a time interval between the inputting of the horizontal synchronizing signal and the outputting of the pixel clock PCLK.

Figure 4:
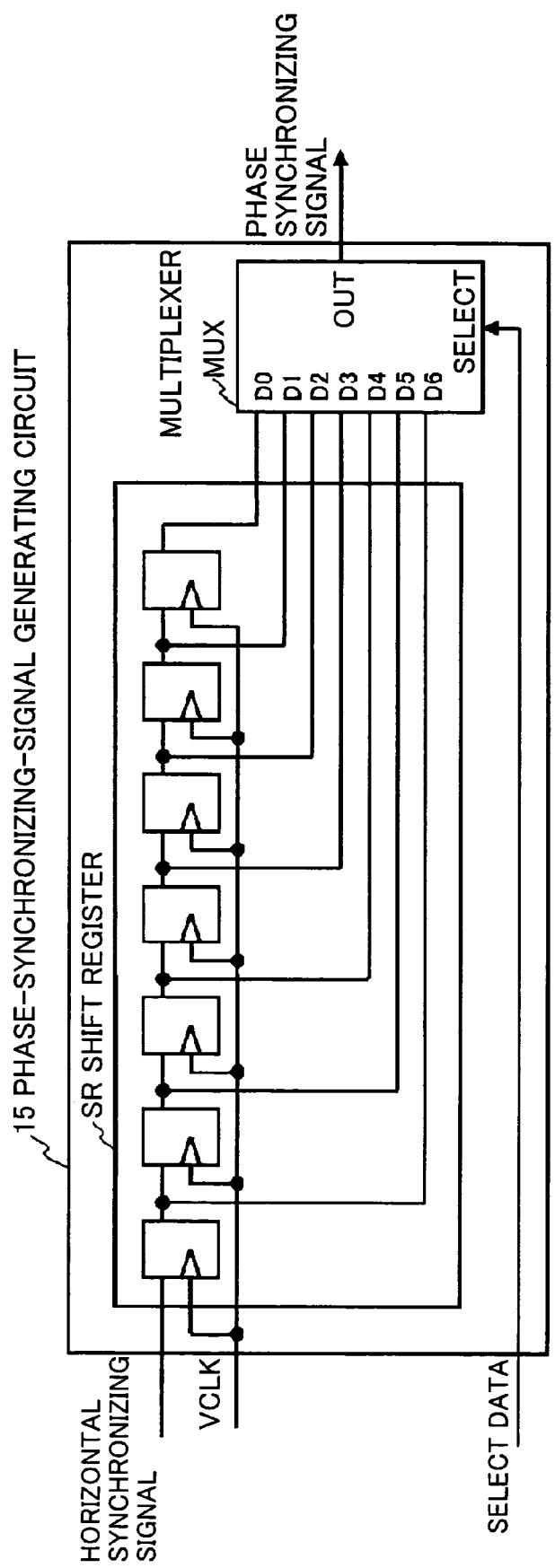
FIG. 4 is a circuit diagrams showing another example of the construction of the phase-synchronizing-signal generating circuit.

FIG. 4 is a circuit diagrams showing another example of the construction of the phase-synchronizing-signal generating circuit 15. The phase-synchronizing-signal generating circuit 15 of FIG. 4 includes a multi-stage shift register SR and a multiplexer MUX. The shift register SR performs a shift operation in response to the high-frequency clock VCLK. Outputs of respective stages of the shift register SR are input into the multiplexer MUX for selection according to externally provided select data. With this provision, a time interval between the inputting of the horizontal synchronizing signal and the outputting of the pixel clock PCLK is adjustable, rather than being fixed.

Figure 5:
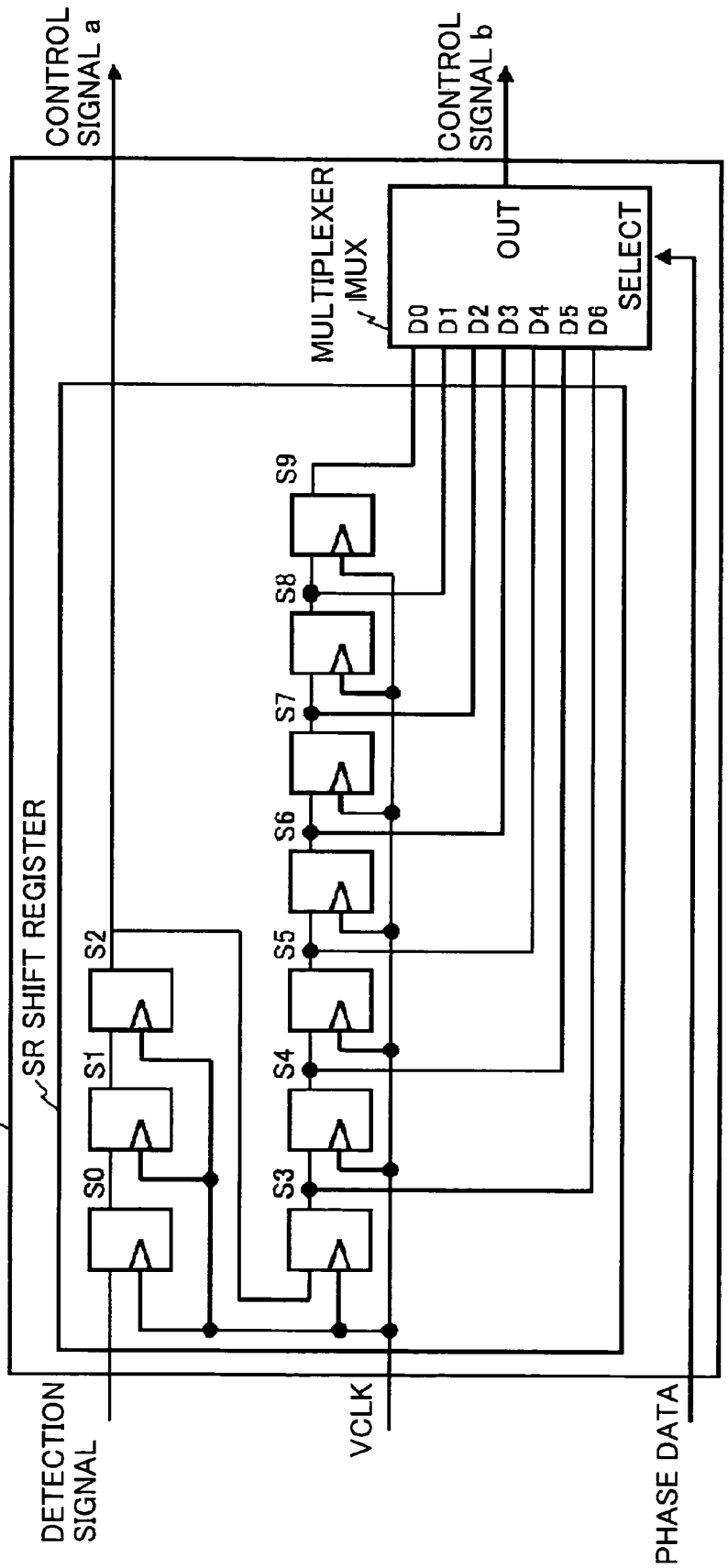
FIG. 5 is a circuit diagram showing an example of the construction of a control-signal generating circuit of FIG. 2.

FIG. 5 is a circuit diagram showing an example of the construction of the control-signal generating circuit 13 of FIG. 2. The control-signal generating circuit 15 includes a shift register SR and a multiplexer MUX. The shift register SR performs a shift operation in response to the high-frequency clock VCLK, thereby successively shifting the supplied detection signal as S0 through S9. An output S2 of an intermediate register stage is extracted as the control signal a. Outputs S3–S9 of the subsequent register stages are input into the multiplexer MUX, so that one of these outputs is selected according to the phase data. The phase data and the output OUT selected by the multiplexer MUX is related as shown in FIG. 8B. The output of the multiplexer MUX is transmitted as the control signal b.

Figure 6:
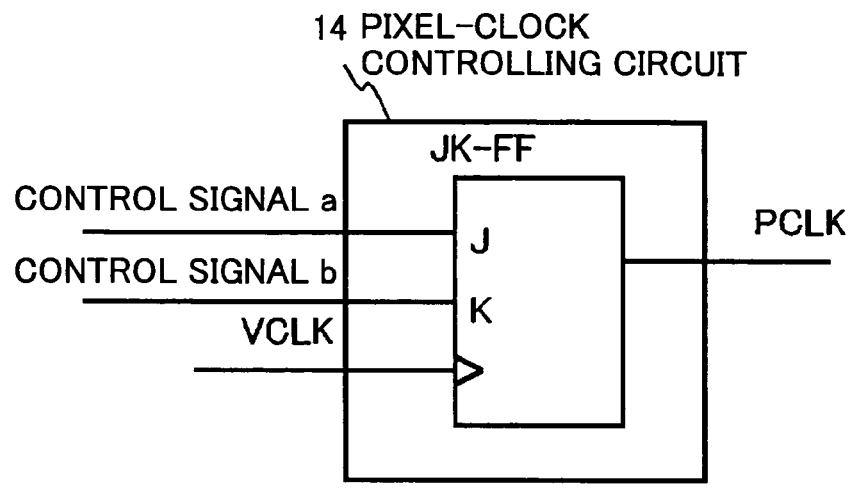
FIG. 6 is a circuit diagram showing an example of the construction of a pixel-clock controlling circuit of FIG. 2.
Figure 7:
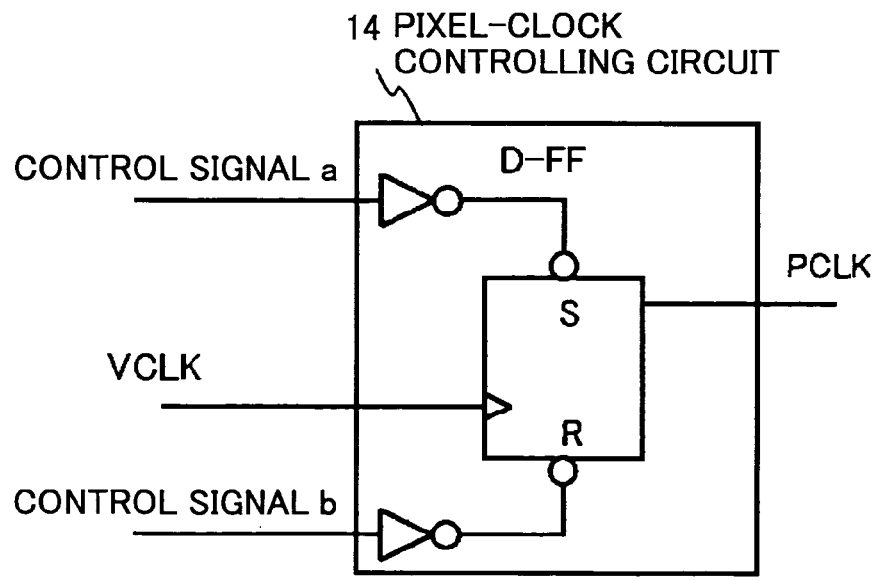
FIG. 7 is a circuit diagram showing another example of the construction of the pixel-clock controlling circuit of FIG. 2.

FIG. 6 is a circuit diagram showing an example of the construction of the pixel-clock controlling circuit 14 of FIG. 2. FIG. 7 is a circuit diagram showing another example of the construction of the pixel-clock controlling circuit 14 of FIG. 2. In FIG. 6, the pixel-clock controlling circuit 14 includes a JK-flip-flop (JK-FF), which outputs a "H" signal at a positive transition of the high-frequency clock VCLK when the control signal a is "H" and the control signal b is "L". When the control signal a is "L" and the control signal b is "H", the JK-flip-flop outputs a "L" signal at a positive transition of the high-frequency clock VCLK. The output of the JK flip-flop serves as the pixel clock PCLK. In FIG. 7, the pixel-clock controlling circuit 14 includes a D-flip-flop (D-FF), which outputs a "H" signal at a positive transition of the high-frequency clock VCLK when the control signal a is "H" and the control signal b is "L". When the control signal a is "L" and the control signal b is "H", the D-flip-flop outputs a "L" signal at a positive transition of the high-frequency clock VCLK. The output of the D-flip-flop serves as the pixel clock PCLK.

In the following, a description will be given of the operation of the pixel-clock generating circuit of this embodiment with reference to a timing chart of FIG. 9.

Figure 9:
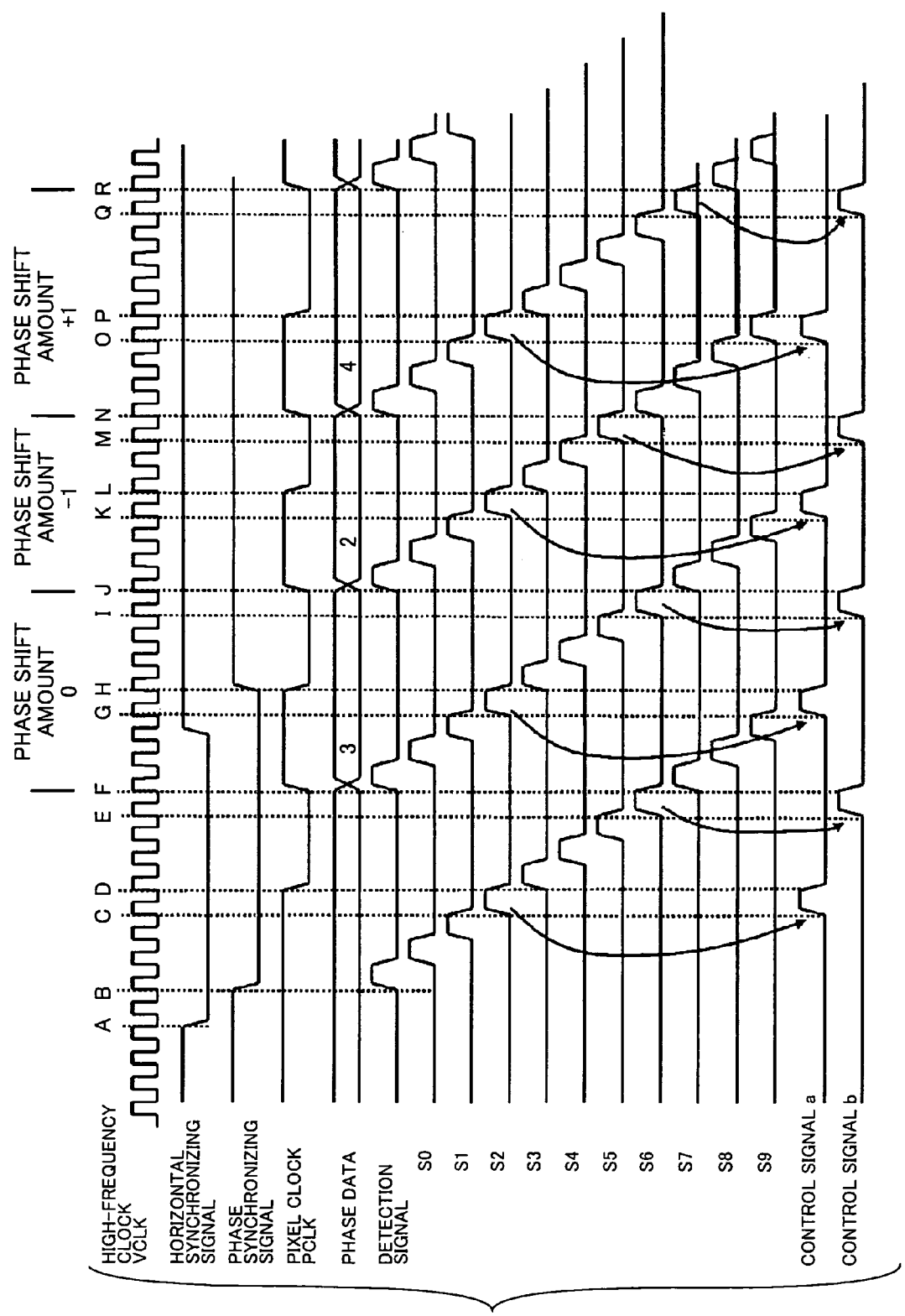
FIG. 9 is a timing chart for explaining an operation from the inputting of a horizontal synchronizing signal to the outputting of a pixel clock.

FIG. 9 shows an operation from the inputting of the horizontal synchronizing signal to the outputting of the pixel clock PCLK, the way the pixel clock PCLK is generated so as to have a duty ratio of 50% equivalent to 8 clock cycles of the high-frequency clock VCLK (zero phase shift), the way the pixel clock PCLK is generated so as to have a phase advancement equivalent to a ⅛ of the 8 clock cycles of the high-frequency clock VCLK (+1 phase shift), and the way the pixel clock PCLK is generated so as to have a phase delay equivalent to a ⅛ of the 8 clock cycles of the high-frequency clock VCLK (−1 phase shift). The phase shift and the phase data are related as shown in FIG. 8A.

In what follows, an operation from the inputting of the horizontal synchronizing signal to the outputting of the pixel clock PCLK will be described first. In this example, the phase data is initially set to "3". In FIG. 9, the horizontal synchronizing signal is input into the phase-synchronizing-signal generating circuit 15 at timing A. In response, the phase synchronizing signal is output at timing B in synchronization with the high-frequency clock VCLK. The transition detecting circuit 12 detects a negative transition of the phase synchronizing signal at timing B, thereby generating a detection signal. The detection signal is successively shifted by the shift register SR (FIG. 5) of the control-signal generating circuit 13. The outputs of respective stages of the shift register SR are shown as S0–S9 in FIG. 9. Since the control signal a is S2, the control signal a becomes "H" at timing C. Since the control signal a is "H" at clock timing D, the pixel-clock controlling circuit 14 shown in FIG. 6 or FIG. 7 changes the pixel clock PCLK from "H" to "L". Since the phase data is "3", the control-signal generating circuit 13 outputs S6 as the control signal b from the multiplexer MUX of FIG. 5, as required by the relationship of FIG. 8B. The control signal b thus becomes "H" at timing E. Since the control signal b is "H" at clock timing F, the pixel-clock controlling circuit 14 shown in FIG. 6 or FIG. 7 changes the pixel clock PCLK from "L" to "H".

In this manner, a time interval from the inputting of the horizontal synchronizing signal to the outputting of the pixel clock PCLK is controlled with a margin of error smaller than one clock cycle of the high-frequency clock.

In what follows, a subsequent operation that generates the pixel clock PCLK will be described. A description will be given first of an operation that generates PCLK with a zero phase shift. When PCLK with a zero phase shift is to be generated, phase data "3" is provided in synchronization with a positive transition of PCLK, (timing F shown in FIG. 9). The transition detecting circuit 12 detects the positive transition of PCLK at timing F, thereby generating a detection signal. The control-signal generating circuit 13 successively shifts the detection signal by use of the shift register SR of FIG. 5. The outputs of respective stages of the shift register SR are shown as S0–S9 in FIG. 9. Since the control signal a is S2, the control signal a becomes "H" at timing G. Since the control signal a is "H" at clock timing H, the pixel-clock controlling circuit 14 shown in FIG. 6 or FIG. 7 changes the pixel clock PCLK from "H" to "L". Since the phase data is "3", the control-signal generating circuit 13 outputs S6 as the control signal b from the multiplexer MUX of FIG. 5, as required by the relationship of FIG. 8B. The control signal b thus becomes "H" at timing I. Since the control signal b is "H" at clock timing J, the pixel-clock controlling circuit 14 shown in FIG. 6 or FIG. 7 changes the pixel clock PCLK from "L" to "H". In this manner, the pixel clock PCLK having a zero phase shift is generated.

In the following, a description will be given of an operation that generates PCLK with a phase shift "−1". When PCLK with a phase shift "−1" is to be generated, phase data "2" is provided in synchronization with a positive transition of PCLK, (timing J shown in FIG. 9). The transition detecting circuit 12 detects the positive transition of PCLK at timing J, thereby generating a detection signal. The control-signal generating circuit 13 successively shifts the detection signal by use of the shift register SR of FIG. 5, thereby generating S0–S9. Since the control signal a is S2, the control signal a becomes "H" at timing K. Since the control signal a is "H" at clock timing L, the pixel-clock controlling circuit 14 shown in FIG. 6 or FIG. 7 changes the pixel clock PCLK from "H" to "L". Since the phase data is "2", the control-signal generating circuit 13 outputs S5 as the control signal b from the multiplexer MUX of FIG. 5, as required by the relationship of FIG. 8B. The control signal b thus becomes "H" at timing M. Since the control signal b is "H" at clock timing N, the pixel-clock controlling circuit 14 shown in FIG. 6 or FIG. 7 changes the pixel clock PCLK from "L" to "H". In this manner, the pixel clock PCLK having a phase shift "−1" is generated.

In the following, a description will be given of an operation that generates PCLK with a phase shift "+1". When PCLK with a phase shift "+1" is to be generated, phase data "4" is provided in synchronization with a positive transition of PCLK, (timing N shown in FIG. 9). The transition detecting circuit 12 detects the positive transition of PCLK at timing N, thereby generating a detection signal. The control-signal generating circuit 13 successively shifts the detection signal by use of the shift register SR of FIG. 5, thereby generating S0–S9. Since the control signal a is S2, the control signal a becomes "H" at timing O. Since the control signal a is "H" at clock timing P, the pixel-clock controlling circuit 14 shown in FIG. 6 or FIG. 7 changes the pixel clock PCLK from "H" to "L". Since the phase data is "4", the control-signal generating circuit 13 outputs S7 as the control signal b from the multiplexer MUX of FIG. 5, as required by the relationship of FIG. 8B. The control signal b thus becomes "H" at timing Q. Since the control signal b is "H" at clock timing R, the pixel-clock controlling circuit 14 shown in FIG. 6 or FIG. 7 changes the pixel clock PCLK from "L" to "H". In this manner, the pixel clock PCLK having a phase shift "+1" is generated.

In the manner as described above, phase data is provided in synchronization with the pixel clock PCLK so as to change the phase of the pixel clock PCLK with respect to each clock cycle.

<Embodiment 2>

Figure 10:
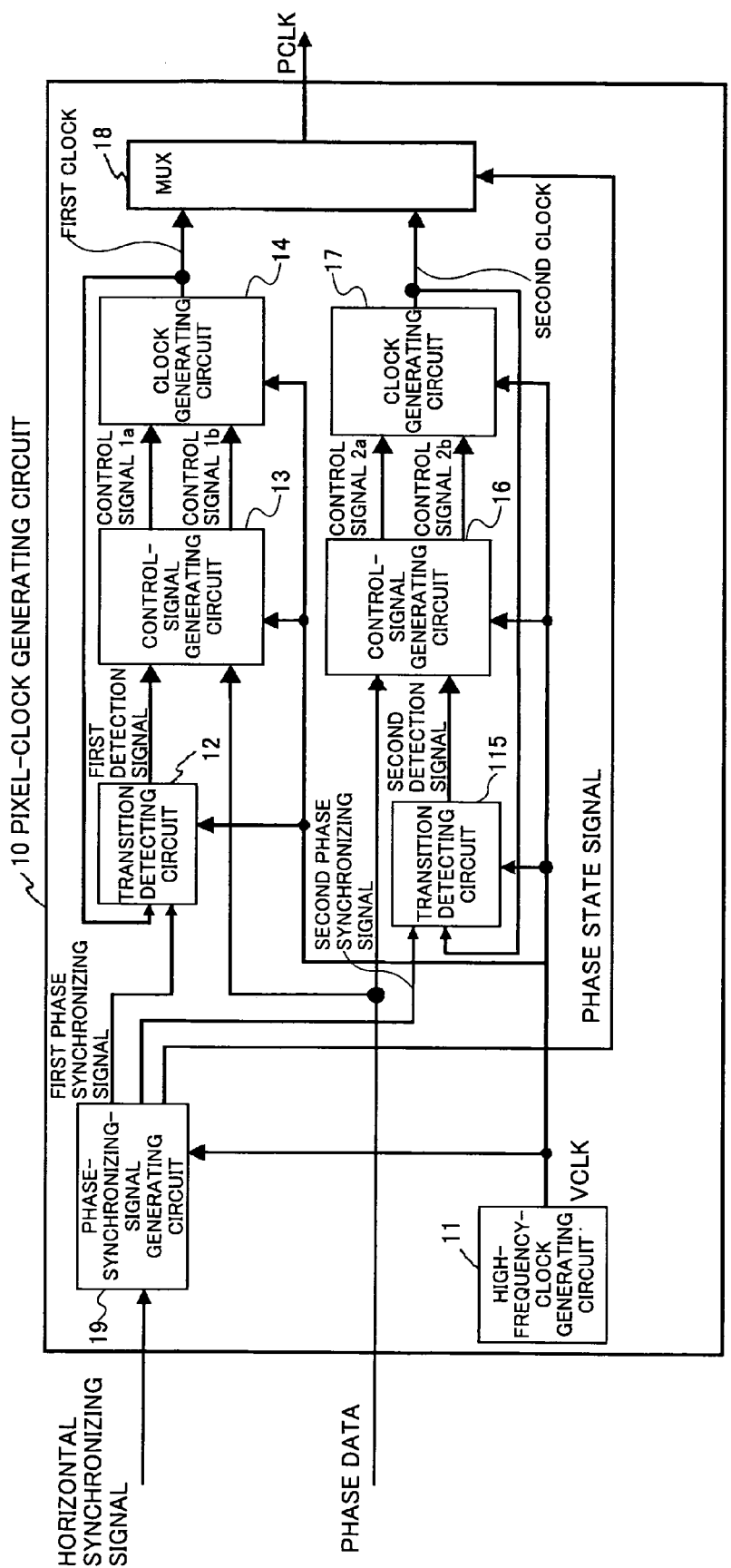
FIG. 10 is a block diagram showing the overall construction of the pixel-clock generating circuit according to a second embodiment.

FIG. 10 is a block diagram showing the overall construction of the pixel-clock generating circuit according to a second embodiment. In FIG. 10, the pixel-clock generating circuit 10 includes the high-frequency-clock generating circuit 11, the transition detecting circuit 12, the control-signal generating circuit 13, the clock generating circuit 14, a transition detecting circuit 115, a control-signal generating circuit 16, a clock generating circuit 17, a multiplexer (MUX) 18, and a phase-synchronizing-signal generating circuit 19.

The high-frequency-clock generating circuit 11 generates a high-frequency clock VCLK, which serves as a basis for the pixel clock PCLK. The transition detecting circuit 12 operates in response to a positive transition of the high-frequency clock VCLK to detect a positive transition of a first clock signal and a negative transition of a first phase synchronizing signal, thereby outputting a pulse signal having a width equal to one clock cycle of the high-frequency clock VCLK. The output of the transition detecting circuit 12 is a first detection signal. The control-signal generating circuit 13 operates in response to a positive transition of the high-frequency clock VCLK to generate a control signal 1a and a control signal 1b based on the output of the transition detecting circuit 12 and the phase data. The clock generating circuit 14 operates in response to a positive transition of the high-frequency clock VCLK to generate a first clock based on the control signal 1a and the control signal 1b. The transition detecting circuit 115 operates in response to a negative transition of the high-frequency clock VCLK to detect a positive transition of a second clock signal and a negative transition of a second phase synchronizing signal, thereby generating a pulse signal having a width equal to one clock cycle of of the high-frequency clock VCLK. The output of the transition detecting circuit 115 is a second detection signal. The control-signal generating circuit 16 operates in response to a negative transition of the high-frequency clock VCLK to output a control signal 2a and a control signal 2b based on the output of the transition detecting circuit 115 and the phase data. The clock generating circuit 17 operates in response to a negative transition of the high-frequency clock VCLK to generate a second clock based on the control signal 2a and the control signal 2b. The multiplexer 18 selects one of the first clock and the second clock in accordance with a phase state signal supplied from the phase-synchronizing-signal generating circuit 19, and outputs the selected clock signal as the pixel clock PCLK.

The phase-synchronizing-signal generating circuit 19 receives a horizontal synchronizing signal, and outputs the first phase synchronizing signal synchronized with a positive transition of the high-frequency clock VCLK, the second phase synchronizing signal synchronized with a negative transition of the high-frequency clock VCLK, and the phase state signal indicative of timing of the horizontal synchronizing signal, i.e., indicative of whether horizontal synchronizing signal falls during the "H" period of the high-frequency clock VCLK or falls during the "L" period of the high-frequency clock VCLK.

As previously described, the phase data indicates a phase shift (i.e., the amount of phase shift) of the pixel clock for the purpose of correcting the fluctuation of scanning caused by the characteristics of a scan lens, for correcting the error of dot positions caused by the fluctuation of rotation of a polygon mirror, and/or for correcting the error of dot positions caused by chromatic aberration of laser light. In this embodiment, the phase data is comprised of 3 bits, which are related to the amount of phase shift as shown in FIG. 8A.

Figure 11:
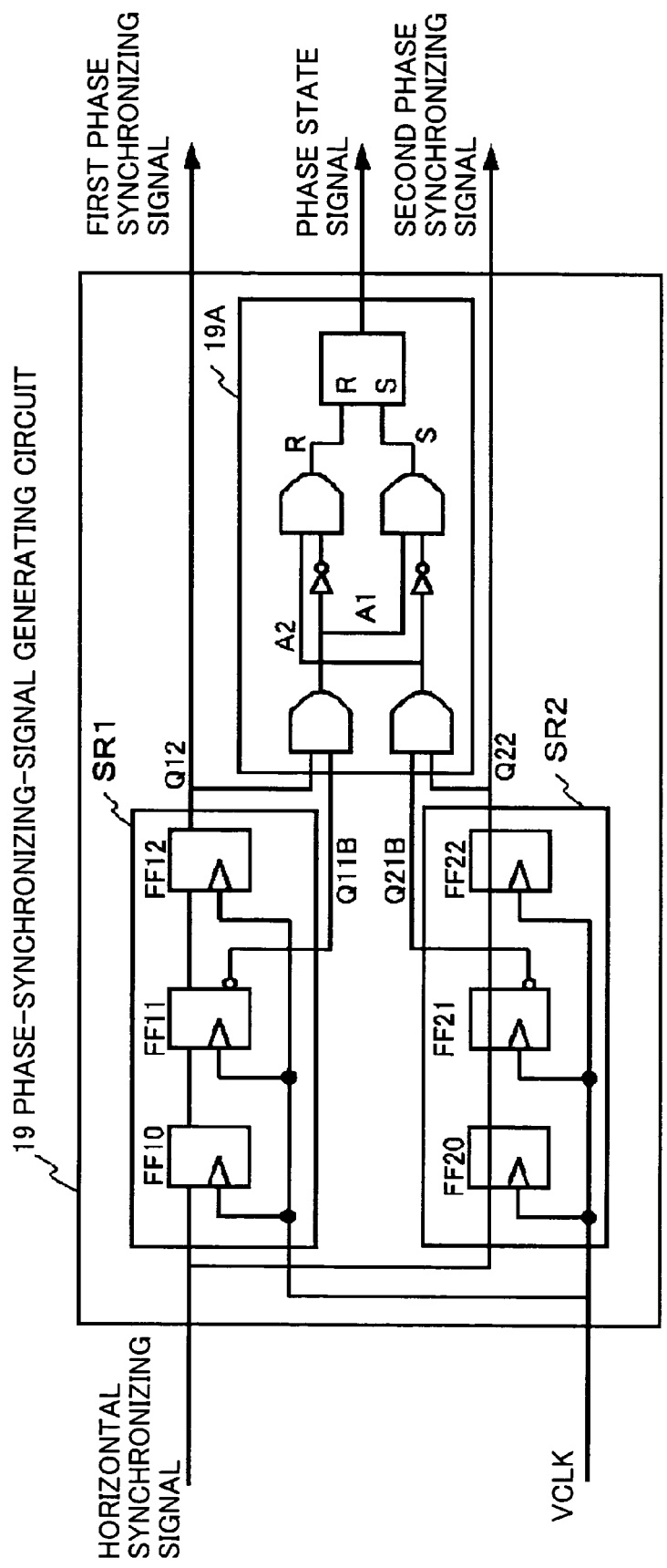
FIG. 11 is a circuit diagram showing an example of the construction of a phase-synchronizing-signal generating circuit of FIG. 10.

FIG. 11 is a circuit diagram showing an example of the construction of the phase-synchronizing-signal generating circuit 19 of FIG. 10. The phase-synchronizing-signal generating circuit 19 includes shift registers. A shift register SR1 comprised of filp-flops FF10 through FF12 performs a shift operation in response to a positive transition of the high-frequency clock VCLK, and synchronizes the supplied horizontal synchronizing signal with a positive transition of the high-frequency clock VCLK for outputting an output Q12 of FF12 as the first phase synchronizing signal. A shift register SR2 comprised of filp-flops FF20 through FF22 performs a shift operation in response to a negative transition of the high-frequency clock VCLK, and synchronizes the supplied horizontal synchronizing signal with a negative transition of the high-frequency clock VCLK for outputting an output Q22 of F22 as the second phase synchronizing signal.

Moreover, the phase-synchronizing-signal generating circuit 19 includes a sequential circuit 19A inclusive of a RS-FF for generating the phase state signal indicative of input timing of the horizontal synchronizing signal. An operation that generate the phase state signal will be described with reference to FIG. 12 and FIG. 13.

Figure 12:
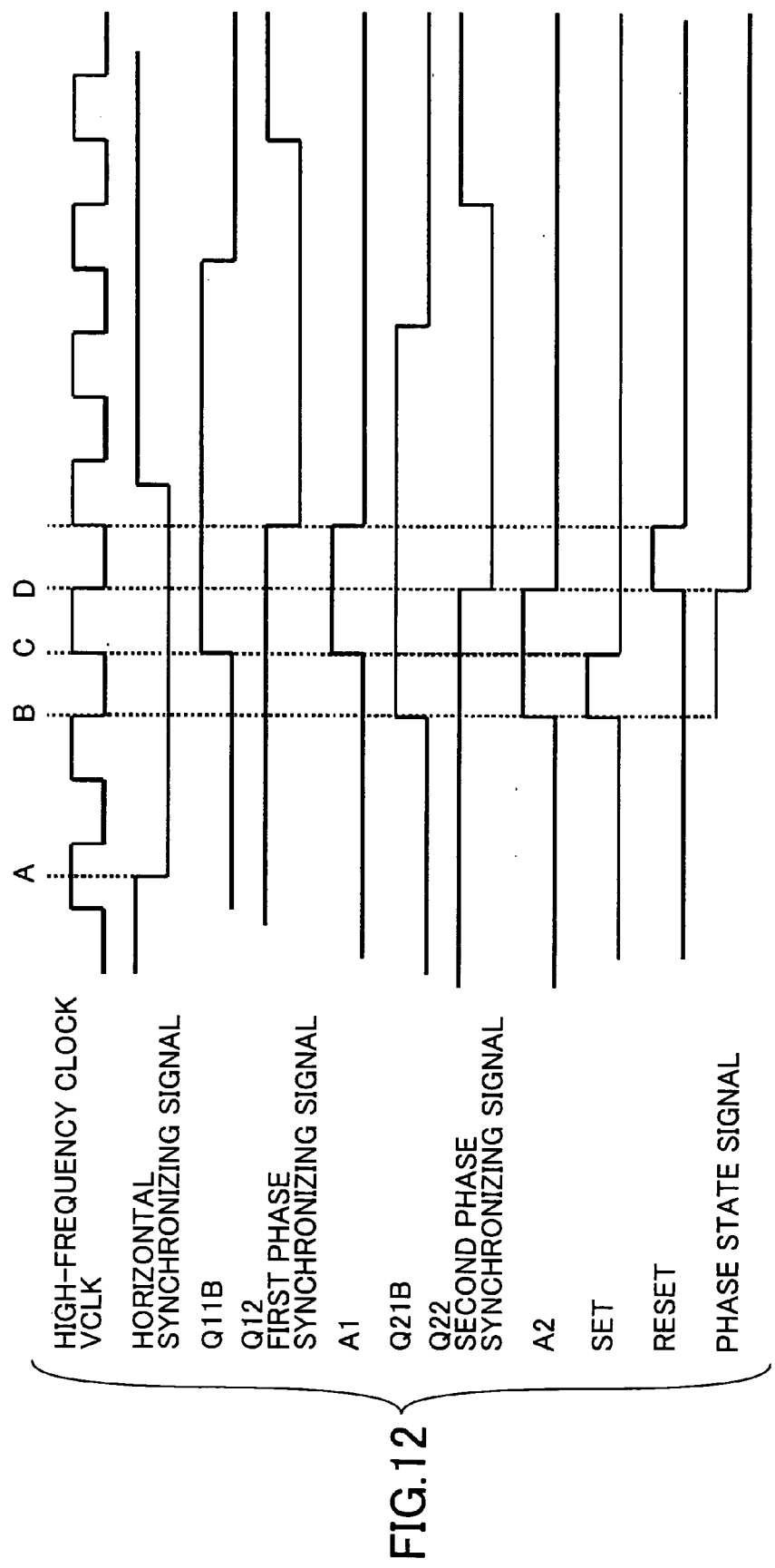
FIG. 12 is a timing chart showing a case where a horizontal synchronizing signal falls during a "H" period of a high-frequency clock.

FIG. 12 is a timing chart showing a case where the horizontal synchronizing signal falls during a "H" period (timing A) of the high-frequency clock VCLK. In this case, signals A1 and A2 are output at timing C and timing B, respectively, as shown in FIG. 12. In response, a SET signal (S in FIG. 11) becomes "H" at timing B, so that the output of RS-FF, i.e., the phase state signal, is set to "H". Thereafter, a RESET signal (R in FIG. 11) is set to "H" at timing D, so that the output of RS-FF, i.e., the phase state signal, is set to "L". In this manner, where the horizontal synchronizing signal falls during a "H" period of the high-frequency clock VCLK, the phase state signal is set to "L".

Figure 13:
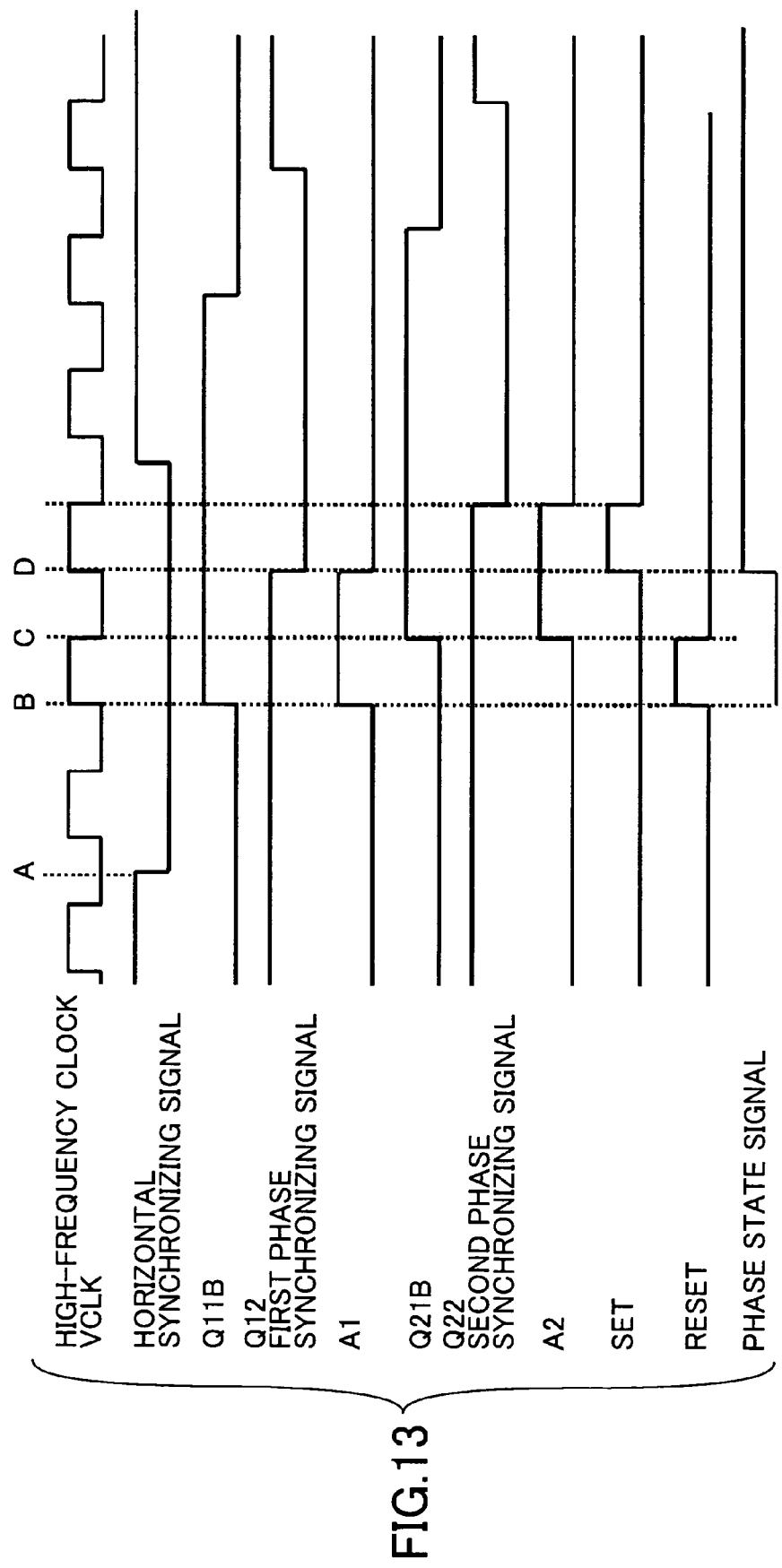
FIG. 13 is a timing chart showing a case where the horizontal synchronizing signal falls during a "L" period of the high-frequency clock.

FIG. 13 is a timing chart showing a case where the horizontal synchronizing signal falls during a "L" period (timing A) of the high-frequency clock VCLK. In this case, the signals A1 and A2 are output at timing B and timing C, respectively, as shown in FIG. 13. In response, the RESET signal (R in FIG. 11) becomes "H" at timing B, so that the output of RS-FF, i.e., the phase state signal, is set to "L". Thereafter, the SET signal (S in FIG. 11) is set to "H" at timing D, so that the output of RS-FF, i.e., the phase state signal, is set to "H". In this manner, where the horizontal synchronizing signal falls during a "L" period of the high-frequency clock VCLK, the phase state signal is set to "H".

Figure 14:
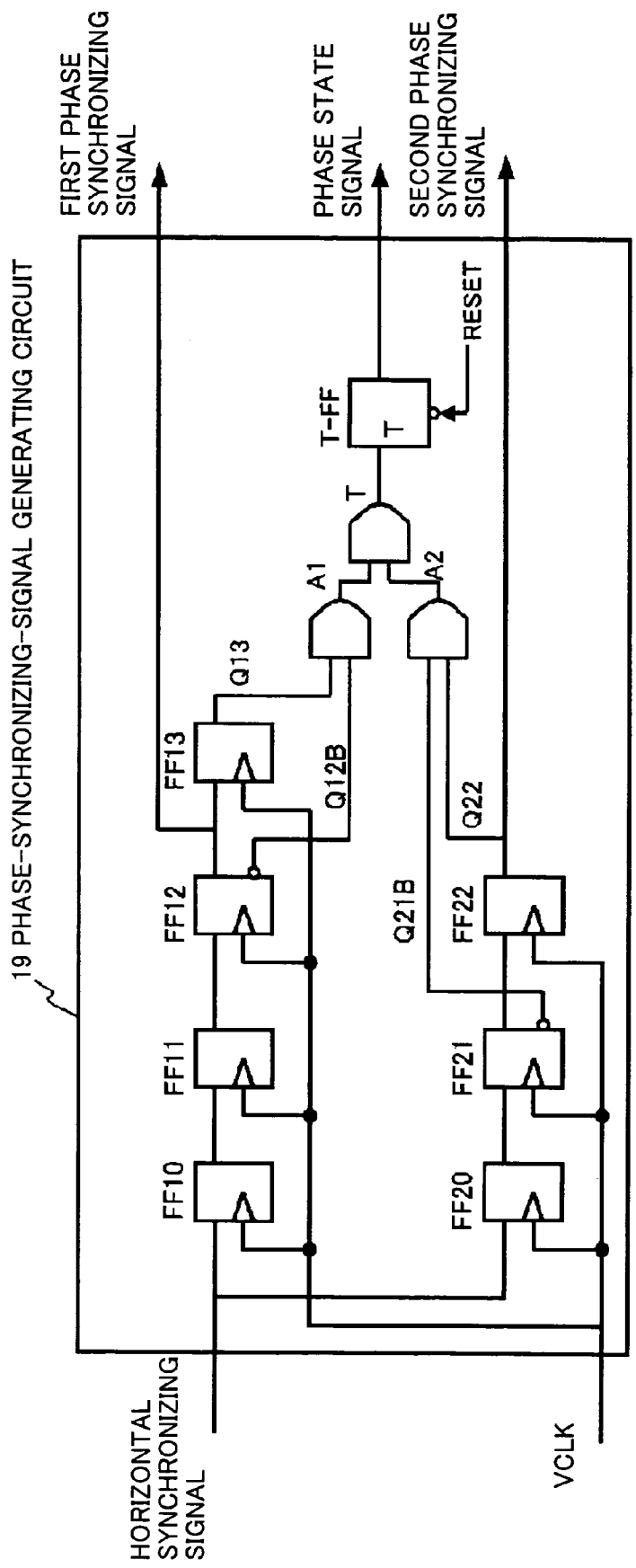
FIG. 14 is a circuit diagram showing another example of the construction of the phase-synchronizing-signal generating circuit of FIG. 9.

FIG. 14 is a circuit diagram showing another example of the construction of the phase-synchronizing-signal generating circuit 19 of FIG. 9. In the phase-synchronizing-signal generating circuit 19 of FIG. 14, circuitry for generating the phase state signal includes a sequential circuit and a T-FF. In this construction, a flip-flop FF13 is additionally provided for the shift register comprised of FF10–FF12 in FIG. 11, and the signal A1 is generated by performing an AND operation between Q13 and Q12B. An operation by the phase-synchronizing-signal generating circuit 19 for generating the phase state signal is illustrated in FIG. 15 and FIG. 16.

Figure 15:
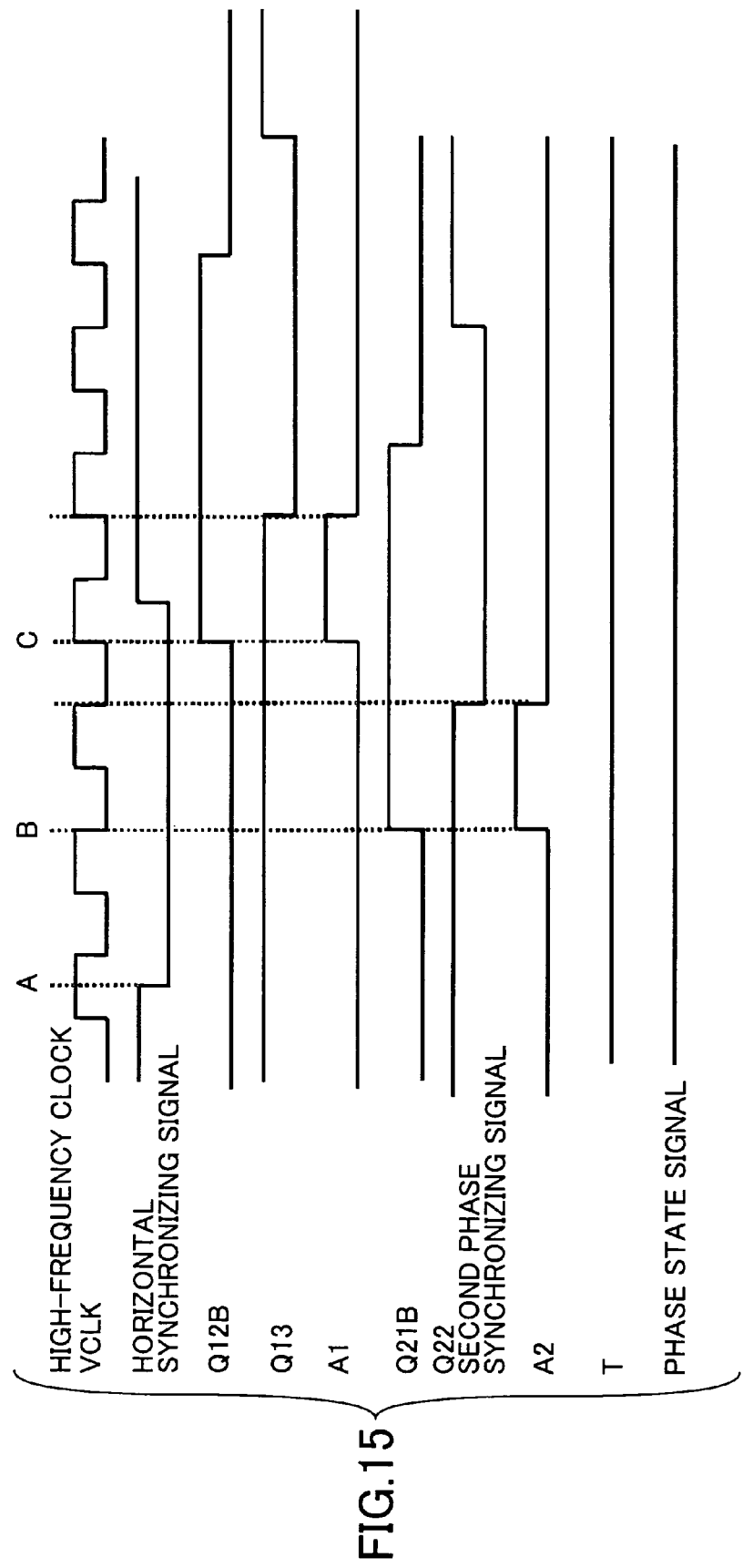
FIG. 15 is a timing chart showing a case where the horizontal synchronizing signal falls during a "H" period of the high-frequency clock.

FIG. 15 is a timing chart showing a case where the horizontal synchronizing signal falls during a "H" period (timing A) of the high-frequency clock VCLK. First, T-FF is reset in response to the detection of inputting of the horizontal synchronizing signal, thereby setting the phase state signal to "L". Then, the signals A2 and A1 are output at timing B and timing C of FIG. 15, respectively. A signal T is generated by performing an AND operation between the signal A1 and the signal A2. Since (A1, A2) never become (H, H) in this case, the signal T remains "L", resulting the output of T-FF also staying "L". The phase state signal is thus "L".

Figure 16:
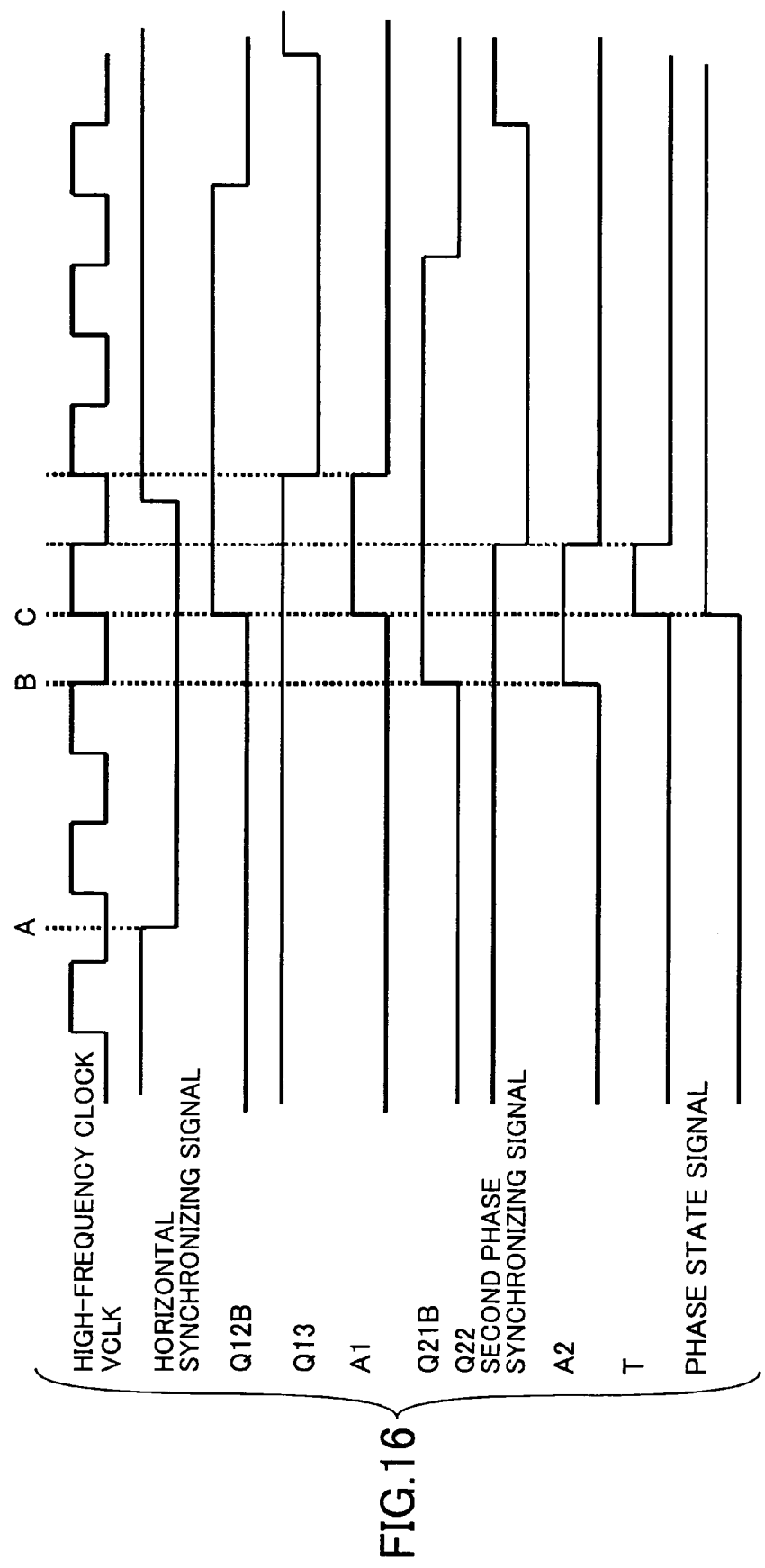
FIG. 16 is a timing chart showing a case where the horizontal synchronizing signal falls during a "L" period of the high-frequency clock.

FIG. 16 is a timing chart showing a case where the horizontal synchronizing signal falls during a "L" period (timing A) of the high-frequency clock VCLK. First, T-FF is reset in response to the detection of inputting of the horizontal synchronizing signal, thereby setting the phase state signal to "L". Then, the signals A2 and A1 are output at timing B and timing C of FIG. 16, respectively. The signal T is generated by performing an AND operation between the signal A1 and the signal A2. Since (A1, A2) becomes (H, H) at timing C in this case, the signal T is changed to "L". As the signal T is set to "H", the output of T-FF is toggled to become "H". As a result, the phase state signal is set to "H".

In the phase-synchronizing-signal generating circuit 19 shown in FIG. 11 and FIG. 14, the outputs of respective stages of a shift register may be provided to a multiplexer for selection as in the case of the phase-synchronizing-signal generating circuit 15 shown in FIG. 4. With this provision, a time interval between the inputting of the horizontal synchronizing signal and the outputting of the pixel clock PCLK is adjustable, rather than being fixed.

The control-signal generating circuit 13 and the control-signal generating circuit 16 shown in FIG. 10 have a circuit construction the same as that of FIG. 5. It should be noted, however, that the control-signal generating circuit 13 operates in response to a positive transition of the high-frequency clock VCLK, and the control-signal generating circuit 16 operates in response to a negative transition of the high-frequency clock VCLK.

The clock generating circuit 14 and the clock generating circuit 17 shown in FIG. 10 have a circuit construction the same as that of FIG. 6 or FIG. 7. It should be noted, however, that the clock generating circuit 14 operates in response to a positive transition of the high-frequency clock VCLK, and the clock generating circuit 17 operates in response to a negative transition of the high-frequency clock VCLK.

The first clock signal in FIG. 10 is generated from the system of the transition detecting circuit 12, the control-signal generating circuit 13, and the clock generating circuit 14. The way the first clock signal is generated is the same as in the first embodiment, and the first clock signal is in synchronization with positive transitions of the high-frequency clock VCLK. The second clock signal in FIG. 10 is generated from the system of the transition detecting circuit 115, the control-signal generating circuit 16, and the clock generating circuit 17. The way the second clock signal is generated is the same as in the first embodiment, but the second clock signal is in synchronization with negative transitions of the high-frequency clock VCLK.

Figure 17:
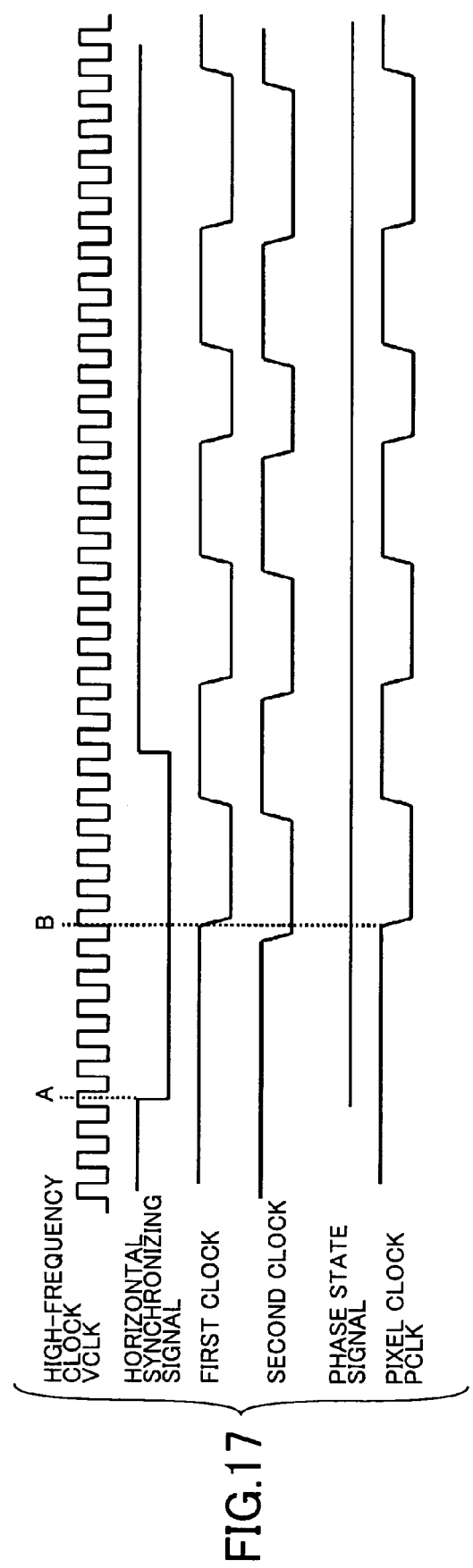
FIG. 17 is a timing chart showing a case where the horizontal synchronizing signal falls during a "H" period of the high-frequency clock.
Figure 18:
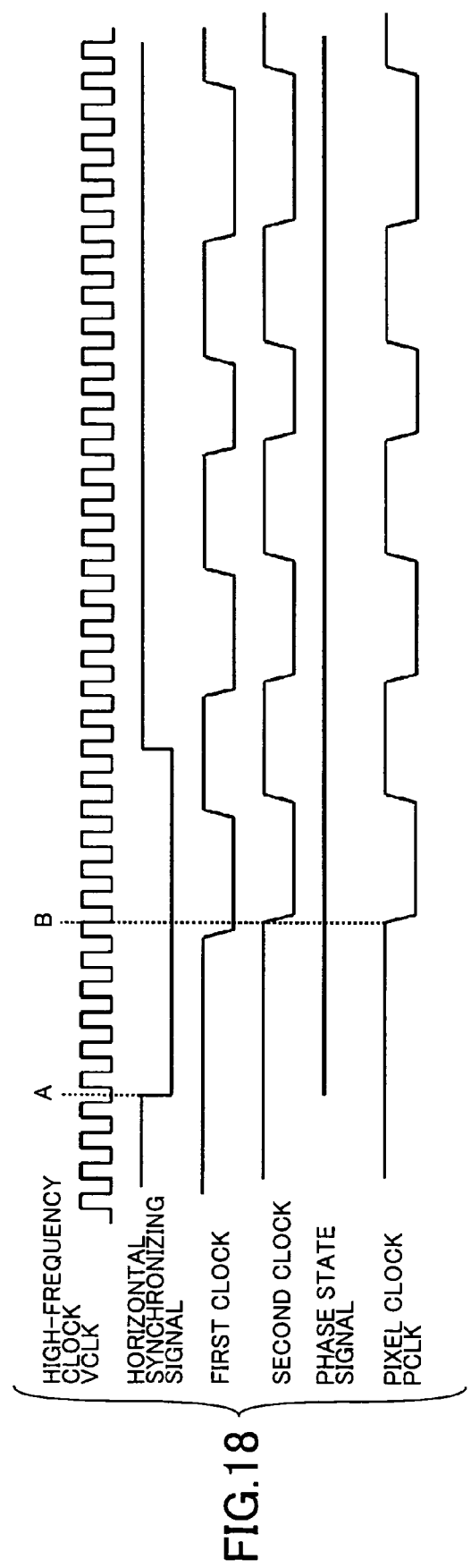
FIG. 18 is a timing chart showing a case where the horizontal synchronizing signal falls during a "L" period of the high-frequency clock.

The horizontal synchronizing signal, the first clock, the second clock, and the pixel clock PCLK in the pixel-clock generating circuit 10 of FIG. 10 are illustrated in FIG. 17 and FIG. 18.

FIG. 17 is a timing chart showing a case where the horizontal synchronizing signal falls during a "H" period of the high-frequency clock VCLK. Since the horizontal synchronizing signal falls during the "H" period of the high-frequency clock VCLK (timing A of FIG. 17), the phase state signal is set to "L". Consequently, the multiplexer 18 of FIG. 10 selects the first clock for outputting as the pixel clock PCLK (timing B of FIG. 17).

FIG. 18 is a timing chart showing a case where the horizontal synchronizing signal falls during a "L" period of the high-frequency clock VCLK. Since the horizontal synchronizing signal falls during the "L" period of the high-frequency clock VCLK (timing A of FIG. 18), the phase state signal is set to "H". Consequently, the multiplexer 18 of FIG. 10 selects the second clock for outputting as the pixel clock PCLK (timing B of FIG. 18).

In the second embodiment as described above, a time interval between the inputting of the horizontal synchronizing signal and the outputting of the pixel clock PCLK is controlled with a margin of error smaller than half a clock cycle of the high-frequency clock. Moreover, the provision of phase data makes it possible to change the phase of the pixel clock PCLK by a step size equal to one clock cycle of the high-frequency clock VCLK.

<Embodiment 3>

Figure 19:
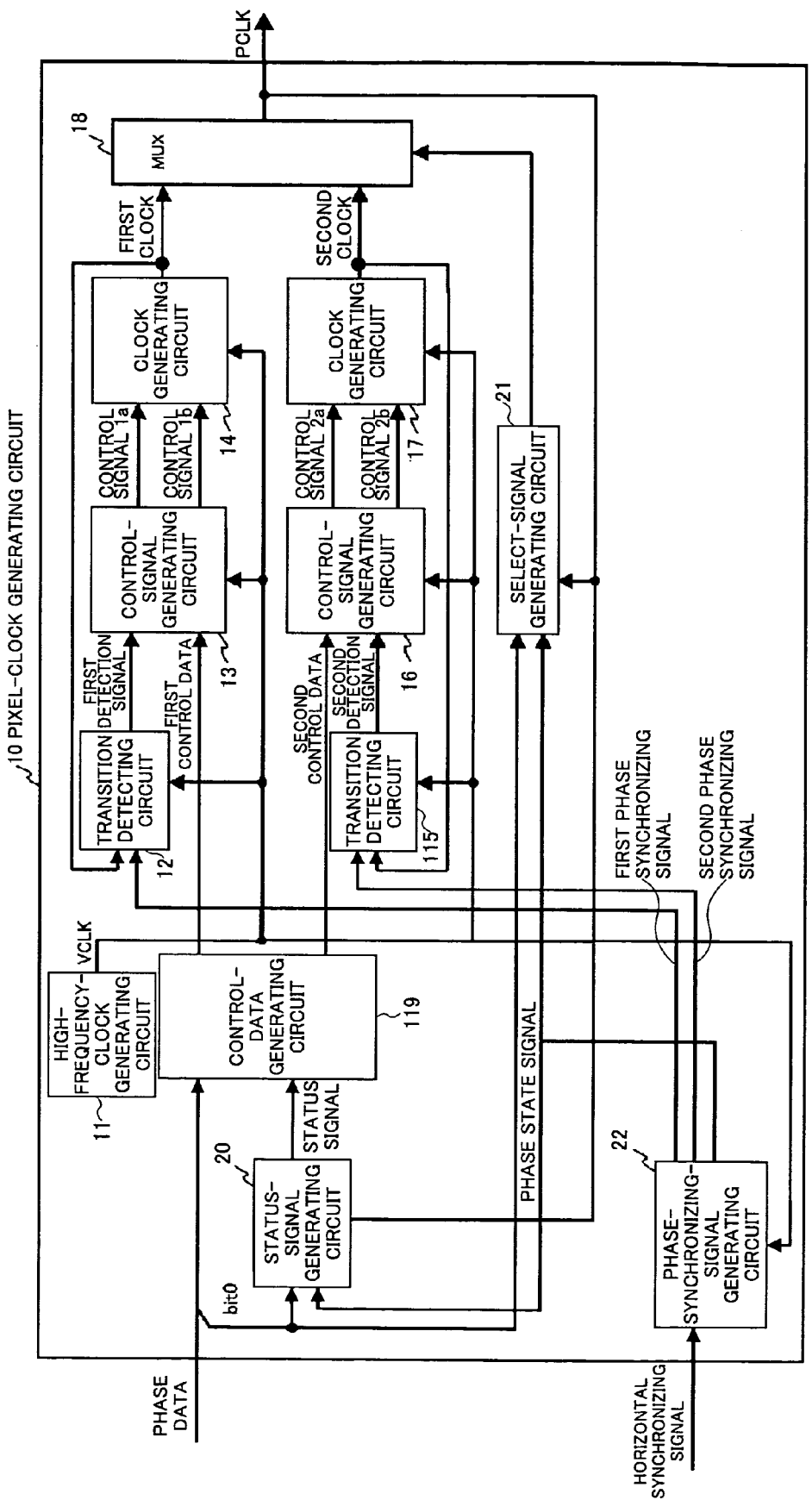
FIG. 19 is a block diagram showing the overall construction of the pixel-clock generating circuit according to a third embodiment.

FIG. 19 is a block diagram showing the overall construction of the pixel-clock generating circuit according to a third embodiment. In FIG. 19, the pixel-clock generating circuit 10 includes the high-frequency-clock generating circuit 11, the transition detecting circuit 12, the control-signal generating circuit 13, the clock generating circuit 14, the transition detecting circuit 115, the control-signal generating circuit 16, the clock generating circuit 17, the multiplexer (MUX) 18, a control-data generating circuit 119, a status-signal generating circuit 20, a select-signal generating circuit 21, and a phase-synchronizing-signal generating circuit 22.

The high-frequency-clock generating circuit 11 generates a high-frequency clock VCLK, which serves as a basis for the pixel clock PCLK. The transition detecting circuit 12 operates in response to a positive transition of the high-frequency clock VCLK to detect a positive transition of a first clock signal, thereby outputting a pulse signal having a width equal to one clock cycle of the high-frequency clock VCLK. The control-signal generating circuit 13 operates in response to a positive transition of the high-frequency clock VCLK to generate the control signal 1a and the control signal 1b based on the output of the transition detecting circuit 12 and first control data supplied from the control data generating circuit 119. The clock generating circuit 14 operates in response to a positive transition of the high-frequency clock VCLK to generate the first clock based on the control signal 1a and the control signal 1b. The transition detecting circuit 115 operates in response to a negative transition of the high-frequency clock VCLK to detect a positive transition of the second clock signal, thereby generating a pulse signal having a width equal to one clock cycle of of the high-frequency clock VCLK. The control-signal generating circuit 16 operates in response to a negative transition of the high-frequency clock VCLK to output the control signal 2a and the control signal 2b based on the output of the transition detecting circuit 115 and second control data supplied from the control-data generating circuit 119. The clock generating circuit 17 operates in response to a negative transition of the high-frequency clock VCLK to generate the second clock based on the control signal 2a and the control signal 2b. The multiplexer 18 selects one of the first clock and the second clock in accordance with a select signal supplied from the select-signal generating circuit 21, and outputs the selected clock signal as the pixel clock PCLK.

The control-data generating circuit 119 generates the first control data and the second control data based on the phase data supplied from an exterior and the status signal supplied from the status-signal generating circuit 20. As previously described, the phase data indicates a phase shift (i.e., the amount of phase shift) of the pixel clock for the purpose of correcting the fluctuation of scanning caused by the characteristics of a scan lens, for correcting the error of dot positions caused by the fluctuation of rotation of a polygon mirror, and/or for correcting the error of dot positions caused by chromatic aberration of laser light. In this embodiment, the phase data is comprised of 3 bits, which are related to the amount of phase shift as shown in FIG. 20.

The status-signal generating circuit 20 toggles its output at timing of a positive transition of the pixel clock PCLK when bit0 of the phase data is 1, thereby generating the status signal. As a result, the status signal indicates a first state when the pixel clock PCLK falls at a positive transition of the high-frequency clock VCLK, and indicates a second state when the pixel clock PCLK falls at a negative transition of the high-frequency clock VCLK. In this embodiment, the status signal is "0" when the pixel clock PCLK falls at a positive transition of the high-frequency clock VCLK, and is "1" when the pixel clock PCLK falls at a negative transition of the high-frequency clock VCLK. An initial value of the status signal is determined based on the phase state signal supplied from the phase-synchronizing-signal generating circuit 22.

The select-signal generating circuit 21 toggles its output at timing of a negative transition of the pixel clock PCLK when bit0 of the phase data is 1, thereby generating the select signal. An initial value of the select signal is determined based on the phase state signal supplied from the phase-synchronizing-signal generating circuit 22.

The clock generating circuit 14 and the clock generating circuit 17 in FIG. 19 have a construction the same as that of FIG. 6 or FIG. 7.

Figure 21:
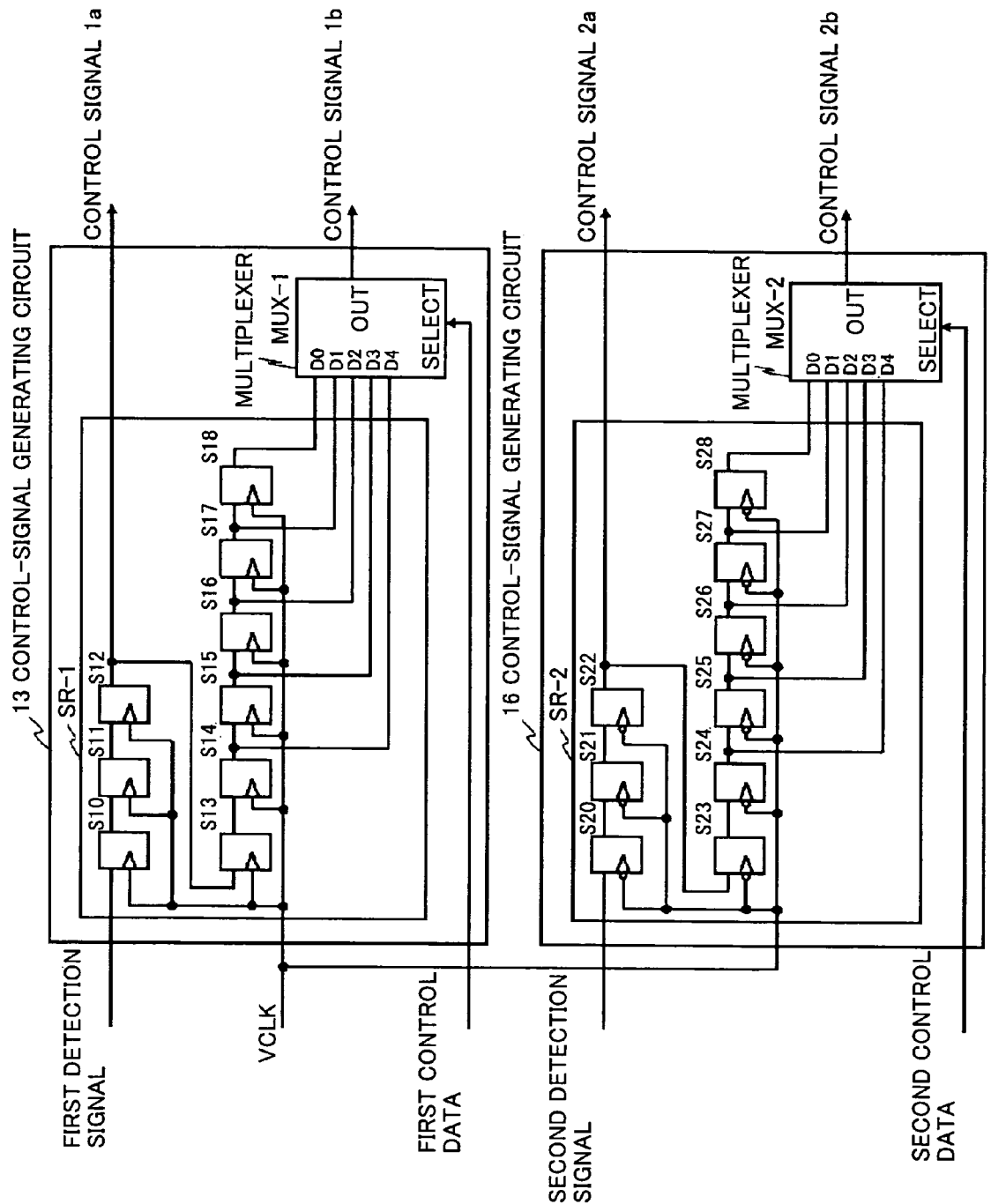
FIG. 21 is a circuit diagram showing an example of the construction of two control-signal generating circuits of FIG. 19.

FIG. 21 is a circuit diagram showing an example of the construction of the control-signal generating circuit 13 and the control-signal generating circuit 16 of FIG. 19. The control-signal generating circuit 13 and the control-signal generating circuit 16 each includes a shift register and a multiplexer. The shift register SR-1 of the control-signal generating circuit 13 performs a shift operation in response to a positive transition of the high-frequency clock VCLK, and the shift register SR-2 of the control-signal generating circuit 16 performs a shift operation in response to a negative transition of the high-frequency clock VCLK. The shift register SR-1 successively shifts the supplied first detection signal as S10 through S18, and extracts an output S12 of an intermediate register stage as the control signal 1*a*. The shift register SR-2 successively shifts the supplied first detection signal as S20 through S28, and extracts an output S22 of an intermediate register stage as the control signal 2*a*. Outputs S14–S18 of the subsequent register stages of the shift register SR1 are input into the multiplexer MUX-1, and outputs S24–S28 of the subsequent register stages of the shift register SR-2 are input into the multiplexer MUX-2. The multiplexer MUX-1 selects one of the register outputs S14–S18 according to the first control data supplied from the control-data generating circuit 119, and outputs the selected signal as the control signal 1*b*. The multiplexer MUX-2 selects one of the register outputs S24–S28 according to the second control data supplied from the control-data generating circuit 119, and outputs the selected signal as the control signal 2*b*. FIG. 22 is a diagram showing a truth table of the multiplexer MUX-1 and the multiplexer MUX-2.

In the following, a description will be given of the control-data generating circuit 119 of FIG. 19. The control-data generating circuit 119 decodes the phase data supplied from an exterior and the status signal supplied from the status-signal generating circuit 20, thereby outputting the first control data and the second control data. Operation of the control-data generating circuit 119 is related to the control-signal generating circuit 13 and the control-signal generating circuit 16. That is, the decoding operation performed by the control-data generating circuit 119 varies depending on an order in which the outputs of the shift registers SR-1 and SR-2 and the inputs of the multiplexer MUX-1 and the multiplexer MUX-2 are provided in the control-signal generating circuit 13 and the control-signal generating circuit 16. In this embodiment, the amount of phase shift and the phase data are related as shown in FIG. 20. FIG. 23 is a diagram showing a truth table of the control-data generating circuit 119 of this case.

The phase-synchronizing-signal generating circuit 22 in FIG. 19 has a construction the same as that of the second embodiment (FIG. 11). According to the phase state signal supplied from the phase-synchronizing-signal generating circuit 22, one of the first clock and the second clock is selected as the pixel clock PCLK that is output for the first time after the inputting of the horizontal synchronizing signal. Further, a time interval between the inputting of the horizontal synchronizing signal and the outputting of the pixel clock PCLK is controlled with a margin of error smaller than half a clock cycle of the high-frequency clock signal.

Figure 24:
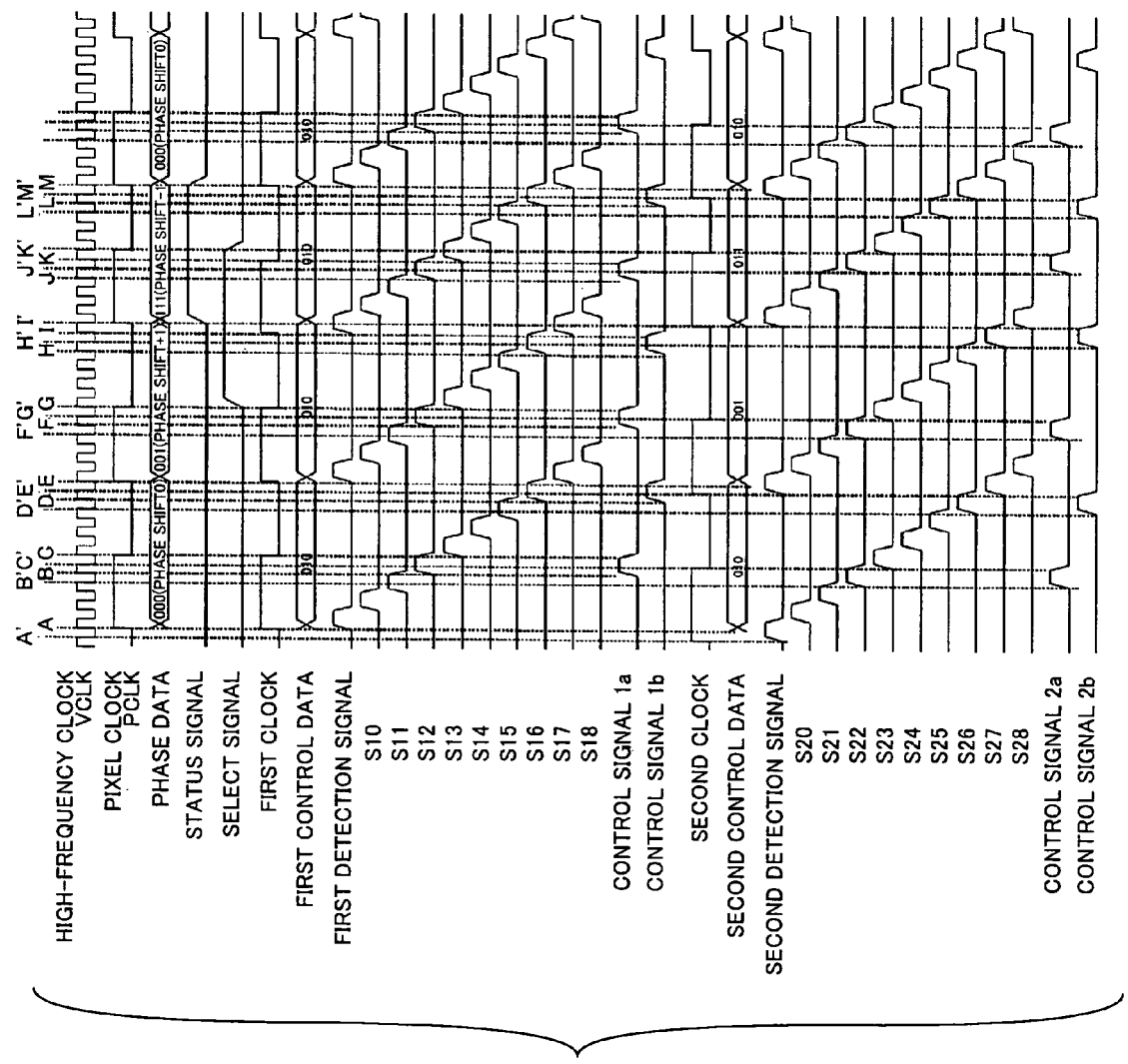
FIG. 24 is a timing chart showing a case where the phase of a pixel clock is controlled according to the third embodiment.
Figure 25:
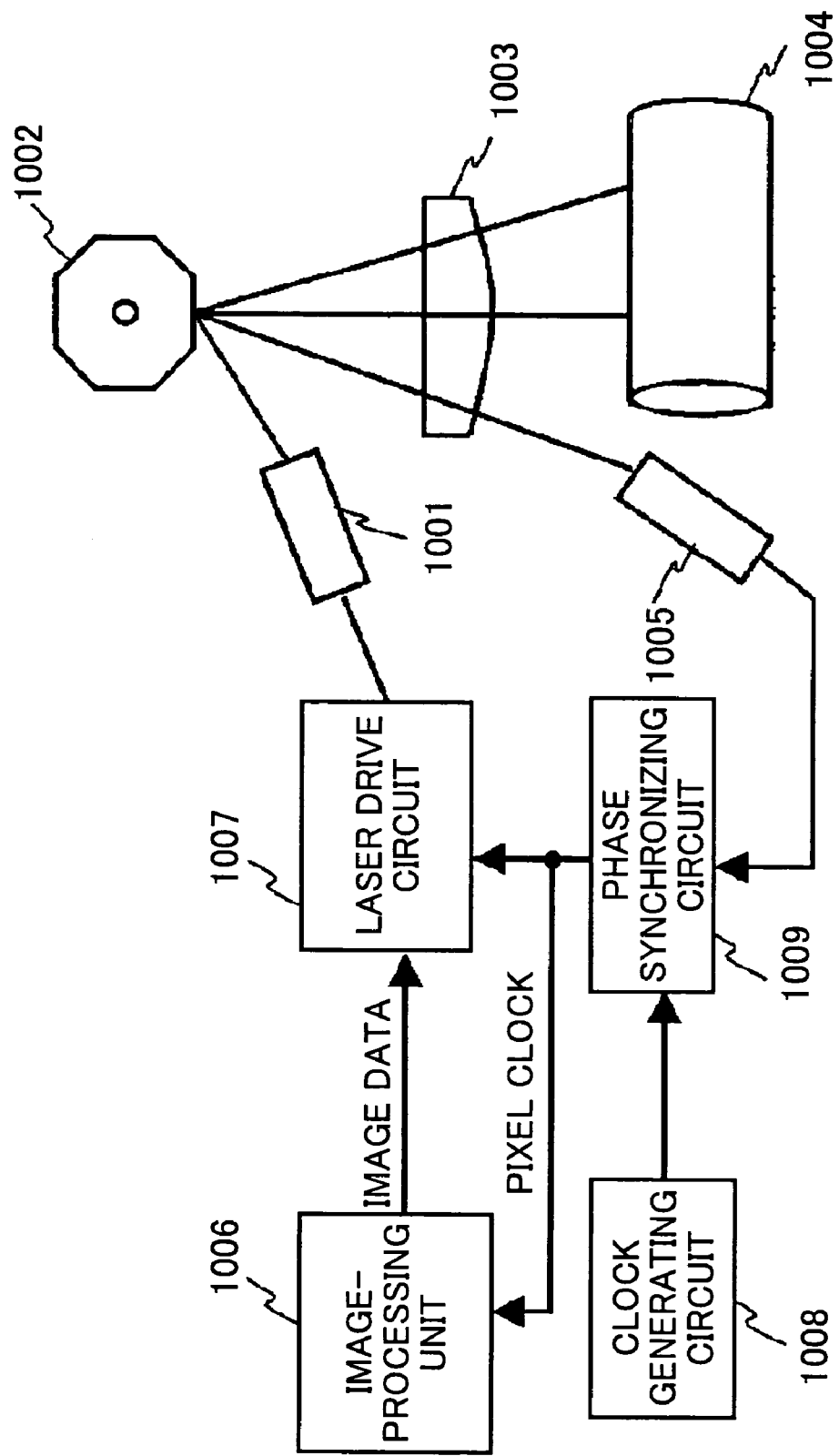
FIG. 25 is an illustrative drawing showing a general construction of an image forming apparatus such as a laser printer or a digital copier.

In the following, the generation of the pixel clock PCLK after the generation of a first clock pulse in the pixel-clock generating circuit 10 of the third embodiment will be described with reference to FIG. 24. FIG. 24 is a timing chart showing a case where the pixel clock PCLK is generated to have a clock cycle equivalent to 8 clock cycles of the high-frequency clock VCLK in the case of a zero phase shift, and, then, the pixel clock PCLK is generated so as to have $+\frac{1}{16}$ phase shift and then to have $-\frac{1}{16}$ phase shift.

A description will be given first of the generation of the pixel clock PCLK having a zero phase shift.

<Generation of First Control Data and Second Control Data>

Phase data "000" indicative of a zero phase shift is provided in synchronization with the pixel clock PCLK (timing A of FIG. 24). The phase data and the status signal (indicating "0" at the beginning) are supplied to the control-data generating circuit 119, which generates the first control data "010" and the second control data "010" according to the truth table of FIG. 23.

<Generation of First Clock>

At timing A of FIG. 24, the transition detecting circuit 12 detects a positive transition of the first clock, thereby generating the first detection signal having a pulse width equal to one clock cycle of the high-frequency clock VCLK. The first detection signal is supplied to the shift register SR-1 of the control-signal generating circuit 13 (FIG. 21), resulting in the register outputs S10–S18 being obtained as shown in FIG. 24. The control signal 1*a* that is the register output S12 is set to "H" at timing B. Since the control signal 1*a* is "H" at clock timing C, the clock generating circuit 14 changes the first clock to "L". Since the first control data is "010", the register output S16 appears at the output of the multiplexer MUX-1 of the control-signal generating circuit 13 as the control signal 1*b*, which becomes "H" at timing D. Since the control signal 1*b* is "H" at clock timing E, the clock generating circuit 14 changes the first clock to "H".

<Generation of Second Clock>

At timing A' of FIG. 24, the transition detecting circuit 115 detects a positive transition of the second clock, thereby generating the second detection signal having a pulse width equal to one clock cycle of the high-frequency clock VCLK. The second detection signal is supplied to the shift register SR-2 of the control-signal generating circuit 16 (FIG. 21), resulting in the register outputs S20–S28 being obtained as shown in FIG. 24. The control signal 2*a* that is the register output S22 is set to "H" at timing B'. Since the control signal 2*a* is "H" at clock timing C', the clock generating circuit 17 changes the second clock to "L". Since the second control data is "010", the register output S26 appears at the output of the multiplexer MUX-2 of the control-signal generating circuit 16 as the control signal 2*b*, which becomes "H" at timing D'. Since the control signal 2*b* is "H" at clock timing E', the clock generating circuit 17 changes the second clock to "H".

<Generation of Pixel Clock PCLK>

Since the select signal is "L", the first clock is output as the pixel clock PCLK.

A description will now be given of the generation of the pixel clock PCLK having a $+\frac{1}{16}$ phase shift.

<Generation of First Control Data and Second Control Data>

Phase data "001" indicative of a "+1" phase shift is provided in synchronization with the pixel clock PCLK (timing E of FIG. 24). As bit0 of the immediately preceding phase data is "0", the status signal output from the status-signal generating circuit 20 is not toggled, staying at "0".

The phase data and the status signal are supplied to the control-data generating circuit 119, which generates the first control data "010" and the second control data "001" according to the truth table of FIG. 23.

<Generation of First Clock>

At timing E of FIG. 24, the transition detecting circuit 12 detects a positive transition of the first clock, thereby generating the first detection signal having a pulse width equal to one clock cycle of the high-frequency clock VCLK. The first detection signal is supplied to the shift register SR-1 of the control-signal generating circuit 13 (FIG. 21), resulting in the register outputs S10–S18 being obtained as shown in FIG. 24. The control signal 1a that is the register output S12 is set to "H" at timing F. Since the control signal 1a is "H" at clock timing G, the clock generating circuit 14 changes the first clock to "L". Since the first control data is "010", the register output S16 appears at the output of the multiplexer MUX-1 of the control-signal generating circuit 13 as the control signal 1b, which becomes "H" at timing H. Since the control signal 1b is "H" at clock timing I, the clock generating circuit 14 changes the first clock to "H".

<Generation of Second Clock>

At timing E' of FIG. 24, the transition detecting circuit 115 detects a positive transition of the second clock, thereby generating the second detection signal having a pulse width equal to one clock cycle of the high-frequency clock VCLK. The second detection signal is supplied to the shift register SR-2 of the control-signal generating circuit 16 (FIG. 21), resulting in the register outputs S20–S28 being obtained as shown in FIG. 24. The control signal 2a that is the register output S22 is set to "H" at timing F'. Since the control signal 2a is "H" at clock timing G', the clock generating circuit 17 changes the second clock to "L". Since the second control data is "001", the register output S27 appears at the output of the multiplexer MUX-2 of the control-signal generating circuit 16 as the control signal 2b, which becomes "H" at timing H'. Since the control signal 2b is "H" at clock timing I', the clock generating circuit 17 changes the second clock to "H".

<Generation of Pixel Clock PCLK>

Since bit0 of the phase data is "1", the select signal is toggled at timing G corresponding to a negative transition of the pixel clock PCLK, thereby changing to "1". As a result, the multiplexer 18 initially outputs the first clock as the pixel clock PCLK (during the period from timing E to timing G of FIG. 24), and then outputs the second clock as the pixel clock PCLK (during the period from timing G to timing I' of FIG. 24) after the change to "1" of the select signal.

A description will now be given of the generation of the pixel clock PCLK having a –1/16 phase shift.

<Generation of First Control Data and Second Control Data>

Phase data "111" indicative of a "–1" phase shift is provided in synchronization with the pixel clock PCLK (timing I' of FIG. 24). As bit0 of the immediately preceding phase data is "1", the status signal output from the status-signal generating circuit 20 is toggled, changing to "1" (timing I' of FIG. 24). The phase data and the status signal are supplied to the control-data generating circuit 119, which generates the first control data "010" and the second control data "011" according to the truth table of FIG. 23.

<Generation of First Clock>

At timing I of FIG. 24, the transition detecting circuit 12 detects a positive transition of the first clock, thereby generating the first detection signal having a pulse width equal to one clock cycle of the high-frequency clock VCLK. The first detection signal is supplied to the shift register SR-1 of the control-signal generating circuit 13 (FIG. 21), resulting in the register outputs S10–S18 being obtained as shown in FIG. 24. The control signal 1a that is the register output S12 is set to "H" at timing J. Since the control signal 1a is "H" at clock timing K, the clock generating circuit 14 changes the first clock to "L". Since the first control data is "010", the register output S16 appears at the output of the multiplexer MUX-1 of the control-signal generating circuit 13 as the control signal 1b, which becomes "H" at timing L. Since the control signal 1b is "H" at clock timing M, the clock generating circuit 14 changes the first clock to "H".

<Generation of Second Clock>

At timing I' of FIG. 24, the transition detecting circuit 115 detects a positive transition of the second clock, thereby generating the second detect-ion signal having a pulse width equal to one clock cycle of the high-frequency clock VCLK. The second detection signal is supplied to the shift register SR-2 of the control-signal generating circuit 16 (FIG. 21), resulting in the register outputs S20–S28 being obtained as shown in FIG. 24. The control signal 2a that is the register output S22 is set to "H" at timing J'. Since the control signal 2a is "H" at clock timing K', the clock generating circuit 17 changes the second clock to "L". Since the second control data is "011", the register output S25 appears at the output of the multiplexer MUX-2 of the control-signal generating circuit 16 as the control signal 2b, which becomes "H" at timing L'. Since the control signal 2b is "H" at clock timing M', the clock generating circuit 17 changes the second clock to "H".

<Generation of Pixel Clock PCLK>

Since bit0 of the phase data is "1", the select signal is toggled at timing K' corresponding to a negative transition of the pixel clock PCLK, thereby changing to "0". As a result, the multiplexer 18 initially outputs the second clock as the pixel clock PCLK (during the period from timing I' to timing K' of FIG. 24), and then outputs the first clock as the pixel clock PCLK (during the period from timing K' to timing M of FIG. 24) after the change to "0" of the select signal.

The above description has been provided with reference to a case where a phase shift is 0, +1/16 (i.e., +1/16 of one clock cycle of PCLK), and –1/16 (i.e., –1/16 of one clock cycle of PCLK). It should be noted that other phase shifts such as +2/16, +3/16, –2/16, and –3/16 can as well be made in the same manner.

In the manner as described above, the pixel clock PCLK is given a phase shift with respect to each clock cycle where the phase shift is made by a shift step equal to ±1/16 of the clock cycle, i.e., by a shift step equal to half the clock cycle of the high-frequency clock VCLK.

In the following, a description will be given with regard to the correction of phase data.

As previously described in connection with FIG. 1, the dot-position-error detecting and controlling unit 110 generates the phase data.

In the present invention, the dot-position-error detecting and controlling unit 110 measures a time difference between the two electrical signals (the first and second horizontal synchronizing signals) supplied from the photo-detectors 101 and 102, respectively, thereby obtaining an actual scan time. Based on the actually measured scan time, feedback correction may be made to the phase data.

For the sake of explanation, a configuration in which one line is comprised of 4800 dots is taken as an example. FIG. 26 is a diagram showing the correction of phase data based on a measured time difference.

In FIG. 26, phase data 200 that is initially stored in memory is aimed at correcting the fluctuation of scanning speed that is faster near the start and near the end and is slower in the middle. If the measured scan time (i.e., a time difference between the first horizontal synchronizing signal and the second horizontal synchronizing signal) is longer than expected, phase-data correction data 201 may be added to the phase data 200, thereby generating new phase data (corrected phase data) 202. This correction is made by adding a "+1" phase shift once in every ten dots.

With such correction of phase data through feedback control, more accurate phase control may be achieved.

Further, the present invention is not limited to these embodiments, but various variations and modifications may be made without departing from the scope of the present invention.

The present application is based on Japanese priority application No. 2003-031057 filed on Feb. 7, 2003, with the Japanese Patent Office, the entire contents of which are hereby incorporated by reference.

What is claimed is:

1. A circuit for generating a pixel clock for use in scanning a laser beam, comprising:
   a high-frequency-clock generating circuit which generates a high-frequency clock having a higher frequency than the pixel clock; and
   a control circuit which generates the pixel clock while shifting a phase of the pixel clock by a shift step proportional to a clock cycle of the high-frequency clock in response to phase data indicative of timing and amounts of phase shifts,
   wherein said control circuit includes:
   a phase-synchronizing-signal generating circuit which synchronizes a horizontal synchronizing signal indicative of a start of each scan with the high-frequency clock for outputting as a phase synchronizing signal;
   a transition detecting circuit which detects a transition of the phase synchronizing signal and a transition of the pixel clock, and, in response thereto, generates a detection signal;
   a control-signal generating circuit which generates one or more control signals in response to the detection signal and the phase data; and
   a pixel-clock controlling circuit which generates the pixel clock while shifting the phase of the pixel clock in response to the one or more control signals.

2. A circuit for generating a pixel clock for use in scanning a laser beam, comprising:
   a high-frequency-clock generating circuit which generates a high-frequency clock having a higher frequency than the pixel clock; and
   a control circuit which generates the pixel clock while shifting a phase of the pixel clock by a shift step proportional to a clock cycle of the high-frequency clock in response to phase data indicative of timing and amounts of phase shifts,
   wherein said control circuit includes:
   a phase-synchronizing-signal generating circuit which receives a horizontal synchronizing signal indicative of a start of each scan, said phase-synchronizing-signal generating circuit synchronizing the horizontal synchronizing signal with a positive transition of the high-frequency clock for outputting as a first phase synchronizing signal, synchronizing the horizontal synchronizing signal with a negative transition of the high-frequency clock for outputting as a second phase synchronizing signal, and generating a state signal indicative of timing of the horizontal synchronizing signal relative to the high-frequency clock;
   a first clock generating circuit which generates a first clock in response to the high-frequency clock, the first phase synchronizing signal, and the phase data;
   a second clock generating circuit which generates a second clock in response to the high-frequency clock, the second phase synchronizing signal, and the phase data; and
   a selecting circuit which selects one of the first clock and the second clock in response to the state signal for outputting as the pixel clock.

3. A circuit for generating a pixel clock for use in scanning a laser beam, comprising:
   a high-frequency-clock generating circuit which generates a high-frequency clock having a higher frequency than the pixel clock; and
   a control circuit which generates the pixel clock while shifting a phase of the pixel clock by a shift step proportional to a clock cycle of the high-frequency clock in response to phase data indicative of timing and amounts of phase shifts,
   wherein said control circuit includes:
   a phase-synchronizing-signal generating circuit which receives a horizontal synchronizing signal indicative of a start of each scan, said phase-synchronizing-signal generating circuit synchronizing the horizontal synchronizing signal with a positive transition of the high-frequency clock for outputting as a first phase synchronizing signal, synchronizing the horizontal synchronizing signal with a negative transition of the high-frequency clock for outputting as a second phase synchronizing signal, and generating a state signal indicative of timing of the horizontal synchronizing signal relative to the high-frequency clock;
   a first clock generating circuit which generates a first clock in response to the high-frequency clock, the first phase synchronizing signal, and the phase data;
   a second clock generating circuit which generates a second clock in response to the high-frequency clock, the second phase synchronizing signal, and the phase data; and
   a selecting circuit which selects one of the first clock and the second clock in response to the state signal and the phase data for outputting as the pixel clock.

4. A circuit for generating a pixel clock for use in scanning a laser beam, comprising:
   a high-frequency-clock generating circuit which generates a high-frequency clock having a higher frequency than the pixel clock; and
   a control circuit which generates the pixel clock while shifting a phase of the pixel clock by a shift step proportional to a clock cycle of the high-frequency clock in response to phase data indicative of timing and amounts of phase shifts,
   wherein said control circuit includes:
   a phase-synchronizing-signal generating circuit which synchronizes a horizontal synchronizing signal indicative of a start of each scan with a plurality of different transition timings of the high-frequency clock to generate a plurality of respective phase synchronizing signals, one of which is selected for outputting as a phase synchronizing signal;
   a transition detecting circuit which detects a transition of the phase synchronizing signal and a transition of the pixel clock, and, in response thereto, generates a detection signal;

a control-signal generating circuit which generates one or more control signals in response to the detection signal and the phase data; and a pixel-clock controlling circuit which generates the pixel clock while shifting the phase of the pixel clock in response to the one or more control signals.

5. A circuit for generating a pixel clock for use in scanning a laser beam, comprising:
   a high-frequency-clock generating circuit which generates a high-frequency clock having a higher frequency than the pixel clock; and
   a control circuit which generates the pixel clock while shifting a phase of the pixel clock by a shift step proportional to a clock cycle of the high-frequency clock in response to phase data indicative of timing and amounts of phase shifts,
   wherein said control circuit includes:
   a phase-synchronizing-signal generating circuit which receives a horizontal synchronizing signal indicative of a start of each scan, said phase-synchronizing-signal generating circuit synchronizing the horizontal synchronizing signal with a plurality of different positive transitions of the high-frequency clock to generate a plurality of respective phase synchronization signals, one of which is selected for outputting as a first phase synchronizing signal, synchronizing the horizontal synchronizing signal with a plurality of different negative transitions of the high-frequency clock to generate a plurality of respective phase synchronization signals, one of which is selected for outputting as a second phase synchronizing signal, and generating a state signal indicative of timing of the horizontal synchronizing signal relative to the high-frequency clock;
   a first clock generating circuit which generates a first clock in response to the high-frequency clock, the first phase synchronizing signal, and the phase data;
   a second clock generating circuit which generates a second clock in response to the high-frequency clock, the second phase synchronizing signal, and the phase data; and
   a selecting circuit which selects one of the first clock and the second clock in response to the state signal for outputting as the pixel clock.

6. A circuit for generating a pixel clock for use in scanning a laser beam, comprising:
   a high-frequency-clock generating circuit which generates a high-frequency clock having a higher frequency than the pixel clock; and
   a control circuit which generates the pixel clock while shifting a phase of the pixel clock by a shift step proportional to a clock cycle of the high-frequency clock in response to phase data indicative of timing and amounts of phase shifts,
   wherein said control circuit includes:
   a phase-synchronizing-signal generating circuit which receives a horizontal synchronizing signal indicative of a start of each scan, said phase-synchronizing-signal generating circuit synchronizing the horizontal synchronizing signal with a plurality of different positive transitions of the high-frequency clock to generate a plurality of respective phase synchronization signals, one of which is selected for outputting as a first phase synchronizing signal, synchronizing the horizontal synchronizing signal with a plurality of different negative transitions of the high-frequency clock to generate a plurality of respective phase synchronization signals, one of which is selected for outputting as a second phase synchronizing signal, and generating a state signal indicative of timing of the horizontal synchronizing signal relative to the high-frequency clock;
   a first clock generating circuit which generates a first clock in response to the high-frequency clock, the first phase synchronizing signal, and the phase data;
   a second clock generating circuit which generates a second clock in response to the high-frequency clock, the second phase synchronizing signal, and the phase data; and
   a selecting circuit which selects one of the first clock and the second clock in response to the state signal and the phase data for outputting as the pixel clock.

7. A method of generating a pixel clock for use in scanning a laser beam, comprising the steps of:
   generating a high-frequency clock having a higher frequency than the pixel clock; and
   generating the pixel clock while shifting a phase of the pixel clock by a shift step proportional to a clock cycle of the high-frequency clock in response to phase data indicative of timing and amounts of phase shifts,
   wherein said step of generating the pixel clock includes the steps of:
   synchronizing a horizontal synchronizing signal indicative of a start of each scan with the high-frequency clock for providing as a phase synchronizing signal;
   detecting a transition of the phase synchronizing signal and a transition of the pixel clock to generate a detection signal;
   generating one or more control signals in response to the detection signal and the phase data; and
   generating the pixel clock while shifting the phase of the pixel clock in response to the one or more control signals.

8. A method of generating a pixel clock for use in scanning a laser beam, comprising the steps of:
   generating a high-frequency clock having a higher frequency than the pixel clock; and
   generating the pixel clock while shifting a phase of the pixel clock by a shift step proportional to a clock cycle of the high-frequency clock in response to phase data indicative of timing and amounts of phase shifts,
   wherein said step of generating the pixel clock includes the steps of:
   receiving a horizontal synchronizing signal indicative of a start of each scan;
   synchronizing the horizontal synchronizing signal with a positive transition of the high-frequency clock for providing as a first phase synchronizing signal;
   synchronizing the horizontal synchronizing signal with a negative transition of the high-frequency clock for providing as a second phase synchronizing signal;
   generating a state signal indicative of timing of the horizontal synchronizing signal relative to the high-frequency clock;
   generating a first clock in response to the high-frequency clock, the first phase synchronizing signal, and the phase data;
   generating a second clock in response to the high-frequency clock, the second phase synchronizing signal, and the phase data; and
   selecting one of the first clock and the second clock in response to the state signal for outputting as the pixel clock.

9. A method of generating a pixel clock for use in scanning a laser beam, comprising the steps of:

generating a high-frequency clock having a higher frequency than the pixel clock; and generating the pixel clock while shifting a phase of the pixel clock by a shift step proportional to a clock cycle of the high-frequency clock in response to phase data indicative of timing and amounts of phase shifts, wherein said step of generating the pixel clock includes the steps of:

receiving a horizontal synchronizing signal indicative of a start of each scan;

synchronizing the horizontal synchronizing signal with a positive transition of the high-frequency clock for providing as a first phase synchronizing signal;

synchronizing the horizontal synchronizing signal with a negative transition of the high-frequency clock for providing as a second phase synchronizing signal;

generating a state signal indicative of timing of the horizontal synchronizing signal relative to the high-frequency clock;

generating a first clock in response to the high-frequency clock, the first phase synchronizing signal, and the phase data;

generating a second clock in response to the high-frequency clock, the second phase synchronizing signal, and the phase data; and selecting one of the first clock and the second clock in response to the state signal and the phase data for outputting as the pixel clock.

* * * * *